(12) United States Patent
Noh et al.

(10) Patent No.: US 12,124,169 B2
(45) Date of Patent: Oct. 22, 2024

(54) NOZZLE STANDBY PORT, APPARATUS FOR TREATING SUBSTRATE INCLUDING THE SAME AND METHOD FOR CLEANING NOZZLE USING THE SAME

(71) Applicant: SEMES CO., LTD., Chungcheongnam-do (KR)

(72) Inventors: Sang Eun Noh, Gyeongsangbuk-do (KR); Ki Sang Eum, Chungcheongnam-do (KR); Chang Suk Oh, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 22 days.

(21) Appl. No.: 17/566,395

(22) Filed: Dec. 30, 2021

(65) Prior Publication Data

US 2022/0206392 A1    Jun. 30, 2022

(30) Foreign Application Priority Data

Dec. 30, 2020  (KR) .......................... 10-2020-0188140

(51) Int. Cl.
 *G03F 7/16*  (2006.01)
 *B05C 5/02*  (2006.01)

(52) U.S. Cl.
 CPC . *G03F 7/16* (2013.01); *B05C 5/02* (2013.01)

(58) Field of Classification Search
 None
 See application file for complete search history.

(56) References Cited

U.S. PATENT DOCUMENTS 5,089,305 A * 2/1992 Ushijima ................ B05B 15/55
                                                    118/302
5,099,782 A * 3/1992 Nakazawa .............. G03F 7/162
                                                    118/100

(Continued)

FOREIGN PATENT DOCUMENTS

CN       101666980 A       3/2010
CN       102762310 A      10/2012

(Continued)

*Primary Examiner* — Jethro M. Pence
(74) *Attorney, Agent, or Firm* — Procopio, Cory, Hargreaves & Savitch LLP

(57) ABSTRACT

Provided is an apparatus for treating a substrate. In the exemplary embodiment, the apparatus for treating the substrate includes a cup configured to have a treating space with an opened upper portion; a support unit configured to support the substrate in the treating space; a liquid supply unit configured to have a treating liquid supply nozzle for supplying a treating liquid to the substrate supported by the support unit; and a nozzle standby port which is positioned outside treating space, provides a standby space in which the nozzle stands by before and after treating the substrate in the treating space, and has a cleaning member for cleaning the nozzle positioned in the standby space, wherein the nozzle standby port includes an insertion hole provided so that a nozzle tip of the treating liquid supply nozzle is insertable; and a spray member configured to spray a cleaning liquid to the nozzle tip inserted into the insertion hole, wherein an impact point of the cleaning liquid may be spaced apart from the center of the nozzle tip at a predetermined distance.

12 Claims, 13 Drawing Sheets

(56) References Cited

U.S. PATENT DOCUMENTS

| | | | | |
|---|---|---|---|---|
| 5,219,615 | A * | 6/1993 | Nakazawa | G03F 7/162 |
| | | | | 427/284 |
| 5,260,174 | A * | 11/1993 | Nakazawa | G03F 7/162 |
| | | | | 430/326 |
| 5,312,487 | A * | 5/1994 | Akimoto | H01L 21/67017 |
| | | | | 118/302 |
| 5,374,312 | A * | 12/1994 | Hasebe | B05C 5/027 |
| | | | | 118/694 |
| 5,772,764 | A * | 6/1998 | Akimoto | G03F 7/162 |
| | | | | 118/54 |
| 5,843,527 | A * | 12/1998 | Sanada | B05C 11/08 |
| | | | | 438/782 |
| 5,939,130 | A * | 8/1999 | Shiraishi | G03F 7/162 |
| | | | | 118/712 |
| 5,960,225 | A * | 9/1999 | Fujimoto | G03F 7/162 |
| | | | | 396/611 |
| 5,985,357 | A * | 11/1999 | Sanada | B05C 11/08 |
| | | | | 118/712 |
| 5,989,632 | A * | 11/1999 | Sanada | G03F 7/162 |
| | | | | 438/758 |
| 6,159,541 | A * | 12/2000 | Sakai | G03F 7/162 |
| | | | | 118/52 |
| 6,165,552 | A * | 12/2000 | Anai | B05D 1/005 |
| | | | | 427/420 |
| 6,207,231 | B1 * | 3/2001 | Tateyama | B05D 3/10 |
| | | | | 118/321 |
| 6,270,576 | B1 * | 8/2001 | Araki | G03F 7/0007 |
| | | | | 118/52 |
| 6,410,194 | B1 * | 6/2002 | Yoshihara | G03F 7/16 |
| | | | | 430/311 |
| 6,444,029 | B1 * | 9/2002 | Kimura | H01L 21/67051 |
| | | | | 118/66 |
| 6,444,409 | B2 * | 9/2002 | Araki | G02B 5/201 |
| | | | | 430/935 |
| 6,447,608 | B1 * | 9/2002 | Sakai | B05D 1/005 |
| | | | | 118/52 |
| 6,458,208 | B1 * | 10/2002 | Anai | G03F 7/162 |
| | | | | 118/316 |
| 6,620,244 | B2 * | 9/2003 | Yoshihara | G03F 7/162 |
| | | | | 118/713 |
| 6,827,782 | B2 * | 12/2004 | Goto | H01L 21/6715 |
| | | | | 118/667 |
| 6,982,002 | B2 * | 1/2006 | Tanaka | H01L 21/6715 |
| | | | | 118/52 |
| 7,267,723 | B2 * | 9/2007 | Goto | B05C 11/1042 |
| | | | | 118/667 |
| 7,575,634 | B2 * | 8/2009 | Shite | H01L 21/67017 |
| | | | | 118/62 |
| 7,790,227 | B2 * | 9/2010 | Shite | G03F 7/162 |
| | | | | 438/758 |
| 7,976,896 | B2 * | 7/2011 | Fukuda | H01L 21/67051 |
| | | | | 438/758 |
| 8,304,018 | B2 * | 11/2012 | Takayanagi | H01L 21/6715 |
| | | | | 438/782 |
| 8,316,795 | B2 * | 11/2012 | Kinoshita | B05B 12/08 |
| | | | | 118/712 |
| 8,568,043 | B2 * | 10/2013 | Matsuoka | G03F 7/3021 |
| | | | | 118/500 |
| 8,667,924 | B2 * | 3/2014 | Sahoda | H01L 21/6715 |
| | | | | 118/316 |
| 8,807,072 | B2 * | 8/2014 | Shimai | B05C 5/02 |
| | | | | 118/320 |
| 8,846,145 | B2 * | 9/2014 | Kinoshita | G03F 7/162 |
| | | | | 438/782 |
| 8,865,396 | B2 * | 10/2014 | Takeguchi | G03F 7/3021 |
| | | | | 430/432 |
| 9,070,731 | B2 * | 6/2015 | Tachibana | H01L 21/68721 |
| 9,171,745 | B2 * | 10/2015 | Suzuki | H01L 21/02197 |
| 9,195,138 | B2 * | 11/2015 | Sasagawa | H01L 21/6715 |
| 9,217,922 | B2 * | 12/2015 | Kubota | B05C 11/1002 |
| 9,256,131 | B2 * | 2/2016 | Takeguchi | G03F 7/3021 |
| 9,613,836 | B2 * | 4/2017 | Ichino | G03F 7/162 |
| 9,620,394 | B2 * | 4/2017 | Kishita | B05C 11/08 |
| 9,623,435 | B2 * | 4/2017 | Wakamoto | B05C 11/1002 |
| 9,687,873 | B2 * | 6/2017 | Tachibana | H01L 21/6715 |
| 9,793,118 | B2 * | 10/2017 | Ahn | B05B 13/0242 |
| 9,818,654 | B2 * | 11/2017 | Hayashi | H01L 21/67253 |
| 9,897,919 | B2 * | 2/2018 | Nonaka | G03F 7/162 |
| 9,899,244 | B2 * | 2/2018 | Kishita | G03F 7/162 |
| 10,048,664 | B2 * | 8/2018 | Hasimoto | G03F 7/162 |
| 10,068,763 | B2 * | 9/2018 | Yoshihara | B05C 11/08 |
| 10,128,136 | B2 * | 11/2018 | Fukuda | G03F 7/3021 |
| 10,168,618 | B2 * | 1/2019 | Sasagawa | G03F 7/162 |
| 10,170,349 | B2 * | 1/2019 | Maeda | B05D 1/005 |
| 10,643,872 | B2 * | 5/2020 | Abe | G03F 7/162 |
| 10,672,606 | B2 * | 6/2020 | Yoshihara | G03F 7/162 |
| 10,838,311 | B2 * | 11/2020 | Nakano | G03F 7/168 |
| 10,879,091 | B2 * | 12/2020 | Maeda | G03F 7/162 |
| 11,148,150 | B2 * | 10/2021 | Choi | B05B 1/044 |
| 11,340,533 | B2 * | 5/2022 | Park | H01L 21/6715 |
| 11,373,889 | B2 * | 6/2022 | Maeda | H01L 21/67178 |
| 11,561,473 | B2 * | 1/2023 | Yamauchi | H01L 21/68764 |
| 2012/0255581 | A1 * | 10/2012 | Kometani | B08B 9/00 |
| | | | | 134/99.1 |
| 2014/0017407 | A1 * | 1/2014 | Shimai | H01L 21/67155 |
| | | | | 427/331 |
| 2015/0096682 | A1 * | 4/2015 | Nakashima | H01L 21/67017 |
| | | | | 414/217 |
| 2015/0099355 | A1 * | 4/2015 | Inatomi | C23C 18/1676 |
| | | | | 118/302 |
| 2015/0165458 | A1 * | 6/2015 | Funakoshi | H01L 21/6715 |
| | | | | 118/302 |
| 2018/0046083 | A1 * | 2/2018 | Kashiyama | G03F 7/30 |
| 2019/0317408 | A1 * | 10/2019 | Goo | H01L 21/6715 |
| 2020/0064741 | A1 * | 2/2020 | Nakashima | G03F 7/3021 |
| 2021/0013058 | A1 * | 1/2021 | Park | H01L 21/67051 |
| 2021/0181638 | A1 * | 6/2021 | Yamauchi | H01L 21/67109 |
| 2021/0278768 | A1 * | 9/2021 | Sakata | H01L 21/67745 |
| 2022/0163891 | A1 * | 5/2022 | Eum | H01L 21/6715 |
| 2022/0163892 | A1 * | 5/2022 | Eum | H01L 21/67017 |
| 2022/0163900 | A1 * | 5/2022 | Eum | H01L 21/67178 |
| 2022/0197145 | A1 * | 6/2022 | Kim | G03F 7/162 |
| 2022/0205090 | A1 * | 6/2022 | Kim | H01L 21/6719 |
| 2022/0205100 | A1 * | 6/2022 | Choi | H01L 21/6715 |
| 2022/0206392 | A1 * | 6/2022 | Noh | H01L 21/6715 |
| 2022/0277971 | A1 * | 9/2022 | Maeda | H01L 21/00 |
| 2022/0388020 | A1 * | 12/2022 | Yasutake | H01L 21/67051 |

FOREIGN PATENT DOCUMENTS

| | | |
|---|---|---|
| CN | 107008603 A | 8/2017 |
| CN | 107442328 A | 12/2017 |
| CN | 108906443 A | 11/2018 |
| CN | 108927303 A | 12/2018 |
| CN | 110095268 A | 8/2019 |
| JP | 07284702 A | 10/1995 |
| JP | H1174179 A | 3/1999 |
| JP | 2006204999 A | 8/2006 |
| JP | 3152963 U | 8/2009 |
| JP | 2010062352 A | 3/2010 |
| JP | 2013251409 A | 12/2013 |
| JP | 2015230957 A | 12/2015 |
| KR | 1020030059046 A | 7/2003 |
| KR | 1020050073103 A | 7/2005 |
| KR | 1020100028488 A | 3/2010 |
| KR | 1020110024228 A | 3/2011 |
| KR | 1020160013352 A | 2/2016 |
| KR | 1020170054999 A | 5/2017 |
| KR | 1020200013403 A | 2/2020 |

* cited by examiner

NOZZLE STANDBY PORT, APPARATUS FOR TREATING SUBSTRATE INCLUDING THE SAME AND METHOD FOR CLEANING NOZZLE USING THE SAME

CROSS-REFERENCE TO RELATED APPLICATIONS

This application claims priority to and the benefit of the Korean Patent Application No. 10-2020-0188140 filed in the Korean Intellectual Property Office on Dec. 30, 2020, the entire contents of which are incorporated herein by reference.

TECHNICAL FIELD P

The present disclosure relates to a nozzle standby port in which a nozzle for liquid-treating a substrate stands by, an apparatus for treating a substrate including the nozzle standby port, and a method for cleaning a nozzle in the nozzle standby port.

BACKGROUND ART

In order to manufacture semiconductor devices, various processes such as cleaning, deposition, photolithography, etching, and ion-implantation are performed. Among these processes, the photolithography process performs coating, exposure, and development steps sequentially. The coating process is a process of coating a photosensitive liquid such as a resist on the surface of a substrate. The exposure process is a step of exposing circuit patterns on a substrate on which a photosensitive film is formed. The development process is a process of selectively developing the exposed region of the substrate.

In general, the coating process is a process of forming a liquid film by coating the photosensitive liquid an the substrate. The thickness of the liquid film acts as an important factor in the exposure process and the development process performed after the coating process.

Before and after the process of coating the photosensitive liquid, a nozzle stands by in a nozzle standby port. A process of cleaning the nozzle may be performed while the nozzle stands by in the nozzle standby port. In one example, a thinner is supplied to a nozzle tip to clean the nozzle. However, in the related art, there is a problem in that the nozzle tip is not cleaned well by supplying the thinner only in one direction to clean the nozzle.

In addition, there is a problem in that it is difficult to separately process a line for supplying a cleaning solution for cleaning the nozzle tip in the nozzle standby port.

SUMMARY OF THE INVENTION

An object of the present disclosure is to provide a nozzle standby port to enhance the cleansing of a treating liquid supply nozzle for coating a photosensitive liquid on a substrate, an apparatus for treating a substrate including the same, and a method for cleaning a nozzle using the same.

Another object of the present disclosure is to provide a nozzle standby port to easily process a spray member for supplying a cleaning liquid to a nozzle tip in the nozzle standby port, an apparatus for treating a substrate including the same, and a method for cleaning a nozzle using the same.

Yet another object of the present disclosure is to provide a nozzle standby port to minimize splashes in the nozzle standby port, an apparatus for treating a substrate including the same, and a method for cleaning a nozzle using the same.

Other objects of the present disclosure are not limited to the objects described above, and other objects, which are not mentioned above, will be apparent to those skilled in the art from the following description.

An exemplary embodiment of the present disclosure provides an apparatus for treating a substrate. In the exemplary embodiment, the apparatus for treating the substrate includes a cup configured to have a treating space with an opened upper portion; a support unit configured to support the substrate in the treating space; a liquid supply unit configured to have a treating liquid supply nozzle for supplying a treating liquid to the substrate supported by the support unit; and a nozzle standby port which is positioned outside the treating space, provides a standby space in which the nozzle stands by before and after treating the substrate in the treating space, and has a cleaning member for cleaning the nozzle positioned in the standby space, wherein the nozzle standby port includes an insertion hole provided so that a nozzle tip of the treating liquid supply nozzle is insertable; and a spray member configured to spray a cleaning liquid to the nozzle tip inserted into the insertion hole, wherein an impact point of the cleaning liquid may be spaced apart from the center of the nozzle tip at a predetermined distance.

In the exemplary embodiment, the spray member may include a container configured to receive and store the cleaning liquid from a cleaning liquid supply source; and an ejection hole formed in the container to eject the cleaning liquid when a predetermined level of cleaning liquid is supplied to the container.

In the exemplary embodiment, the container may be provided in a ring shape surrounding the insertion hole.

In the exemplary embodiment, a plurality of ejection holes may be provided to surround the nozzle tip inserted into the insertion hole.

In the exemplary embodiment, the nozzle standby port may further include a liquid tank configured to accommodate the cleaning liquid ejected to the nozzle tip; and a dispersion member provided in the liquid tank and positioned below the insertion hole.

In the exemplary embodiment, the nozzle standby port may further include an exhaust port configured to exhaust an atmosphere in the liquid tank, and the dispersion member may be positioned below the exhaust port.

In the exemplary embodiment, the dispersion member may be provided in a spherical shape.

In the exemplary embodiment, the upper surface of the dispersion member may be provided to be inclined downward toward the bottom.

In the exemplary embodiment, a concave portion may be formed on the lower surface of the dispersion member.

In the exemplary embodiment, the liquid supply unit may further include a pre-wetting liquid supply nozzle configured to supply a pre-wetting liquid onto the substrate; and a support body configured to support the treating liquid supply nozzle and the pre-wetting liquid supply nozzle.

In the exemplary embodiment, the treating liquid may be a photoresist, and the cleaning liquid and the pre-wetting liquid may be provided as a thinner.

In the exemplary embodiment, the predetermined distance may be provided further as the diameter of the nozzle tip increases.

An exemplary embodiment of the present disclosure provides a nozzle standby port. In the exemplary embodiment, the nozzle standby port may include an insertion hole provided so that the nozzle tip of the nozzle is insertable; and a spray member configured to spray a cleaning liquid to the nozzle tip inserted into the insertion hole, wherein an impact point of the cleaning liquid may be spaced apart from the center of the nozzle tip at a predetermined distance.

In the exemplary embodiment, the spray member may include a container configured to receive and store the cleaning liquid from a cleaning liquid supply source; and an ejection hole formed in the container to eject the cleaning liquid when a predetermined level of cleaning liquid is supplied to the container.

In the exemplary embodiment the nozzle standby port may further include a liquid tank configured to accommodate the cleaning liquid ejected to the nozzle tip; and a dispersion member provided in the liquid tank and positioned below the insertion hole.

In the exemplary embodiment the predetermined distance may be provided further as the diameter of the nozzle tip increases.

An exemplary embodiment of the present disclosure provides a method for cleaning a nozzle. In the exemplary embodiment the method tor cleaning the nozzle may include spraying a cleaning liquid toward a nozzle tip having an ejection hole for ejecting a cleaning liquid, wherein an impact point of the cleaning liquid may be spaced apart front the center of the nozzle tip at a predetermined distance.

In the exemplary embodiment the nozzle standby port may be provided with a spray member configured to eject the cleaning liquid to the nozzle tip, wherein the spray member may include a container configured to receive and store the cleaning liquid from a cleaning liquid supply source; and an ejection hole provided to eject the cleaning liquid when a predetermined level of cleaning liquid is supplied to the container, wherein the cleaning liquid may be ejected through the ejection hole in an over-flow manner.

In the exemplary embodiment, a plurality of ejection holes may be provided to surround the nozzle tip.

In the exemplary embodiment, the predetermined distance may be provided further as the diameter of the nozzle tip increases.

According to the exemplary embodiment of the present disclosure, it is possible to enhance the cleansing of a treating liquid supply nozzle for coating a photosensitive liquid on a substrate.

Further, it is possible to easily process a spray member for supplying a cleaning liquid to a nozzle up in a nozzle standby port.

Further, it is possible to minimize splashes in the nozzle standby port.

The effect of the present disclosure is not limited to the foregoing effects, and non-mentioned effects will be clearly understood by those skilled in the art from the present specification and the accompanying drawings.

DETAILED DESCRIPTION

Figure 1:
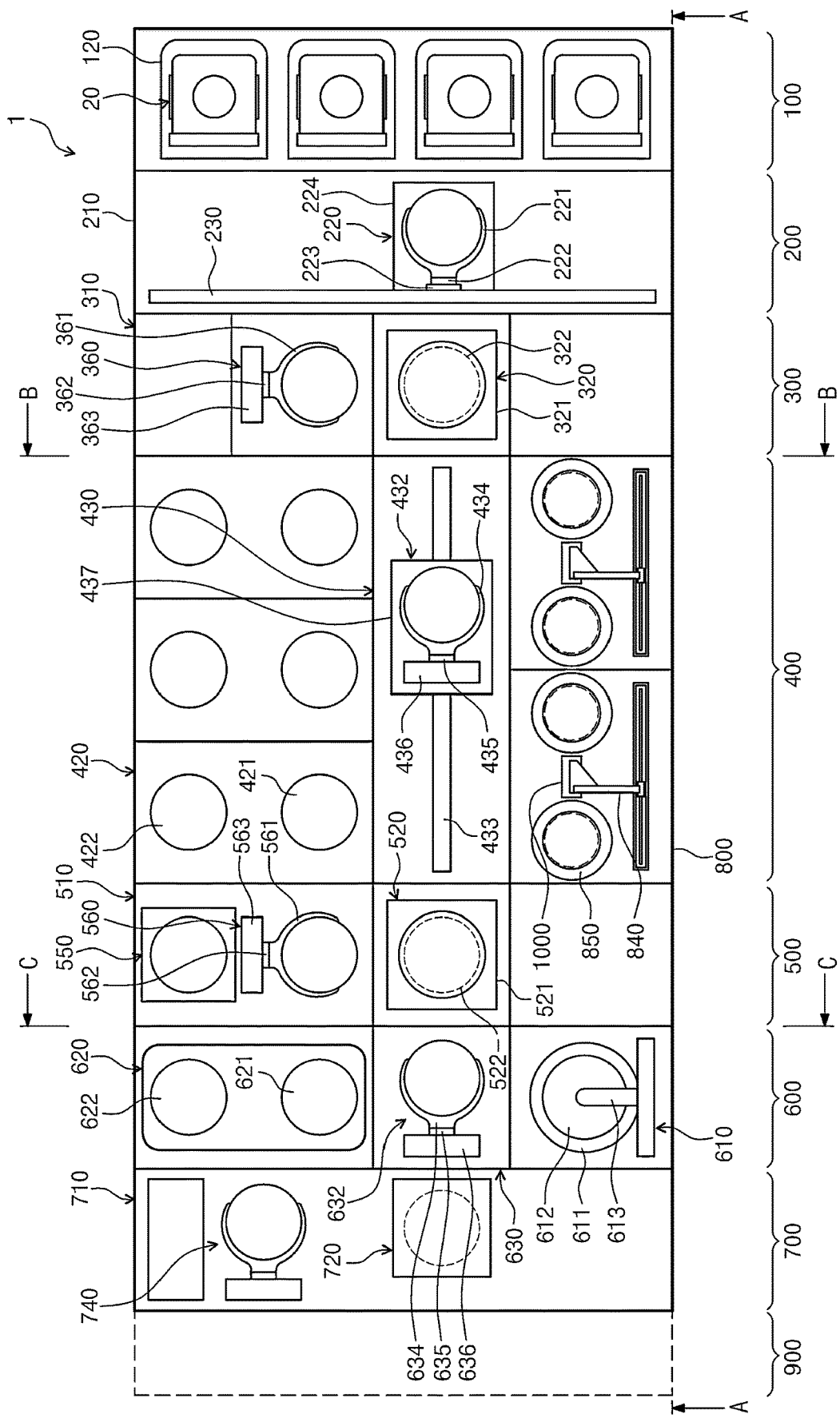
FIG. 1 is a plan view of a substrate treating apparatus according to an exemplary embodiment of the present disclosure.

Hereinafter, an exemplary embodiment of the present disclosure will be described in more detail with reference to the accompanying drawings. The exemplary embodiment of the present disclosure can be modified in various forms, and it should not be construed that the scope of the present disclosure is limited to exemplary embodiments described below. The exemplary embodiments are provided to more completely describe the present disclosure to those skilled in the art. Therefore, shapes, and the like of components in the drawings will be exaggerated to emphasize a more clear description.

An apparatus of the exemplary embodiment may be used to perform a photolithography process on a substrate such as a semiconductor wafer or a flat panel display panel. In particular, the apparatus of the exemplary embodiment may be connected to an exposure apparatus and used to perform a coating process and a developing process on the substrate. Hereinafter, a case in which a wafer is used as the substrate will be described as an example.

Figure 2:
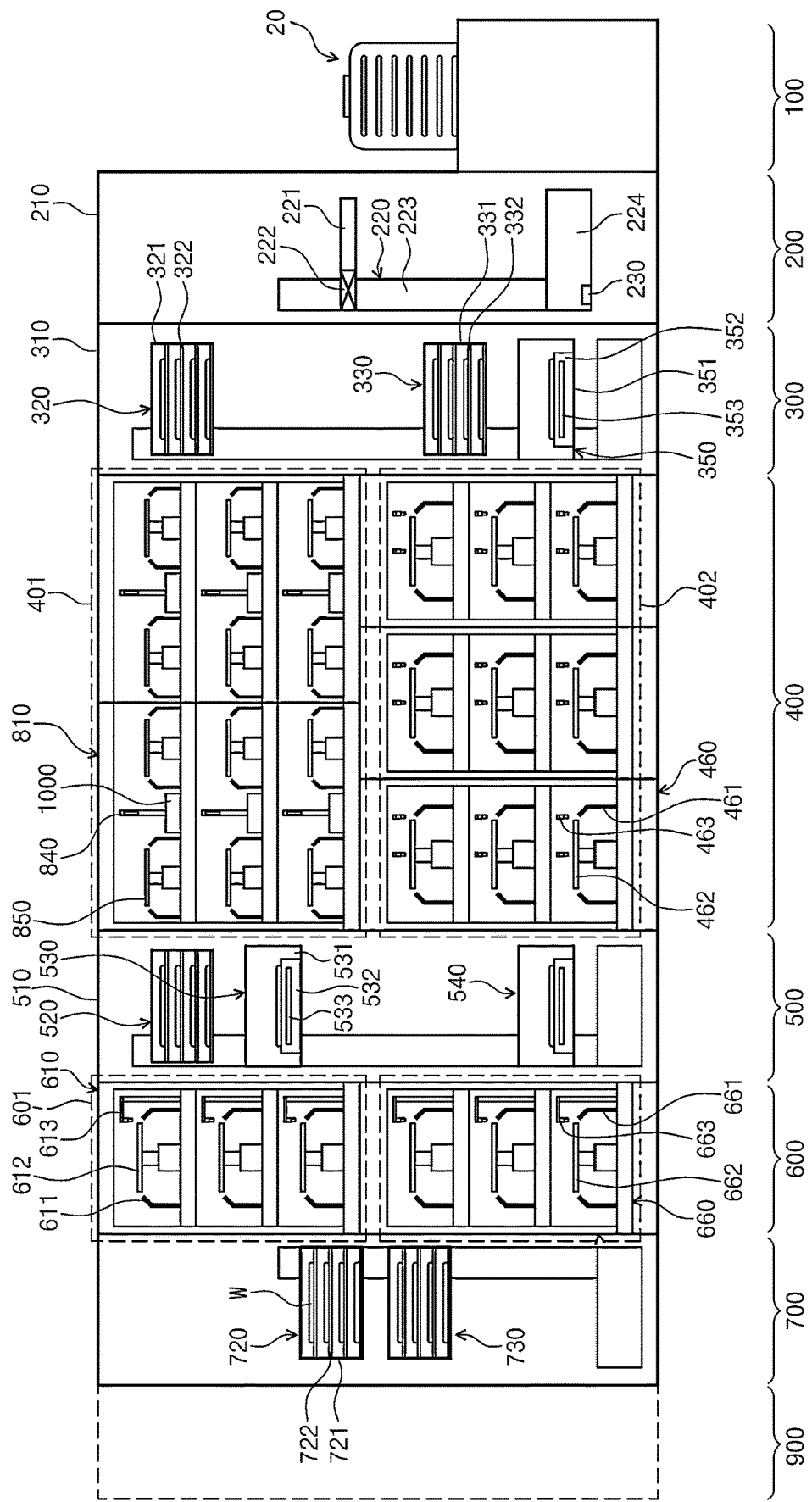
FIG. 2 is a cross-sectional of the apparatus of FIG. 1 viewed from a direction A-A.
Figure 3:
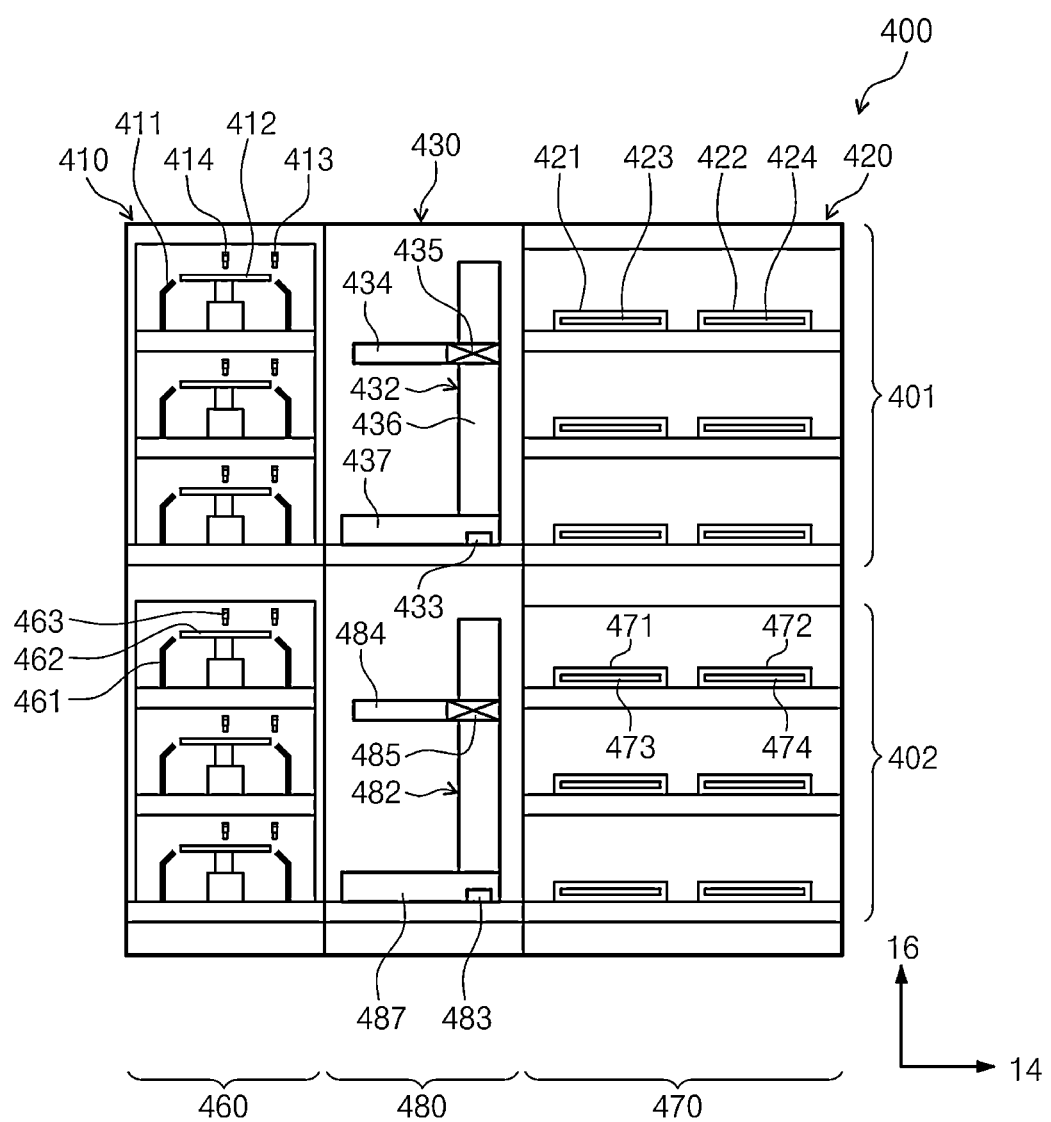
FIG. 3 is a cross-sectional view of the apparatus of FIG. 1 viewed from a direction B-B.
Figure 4:
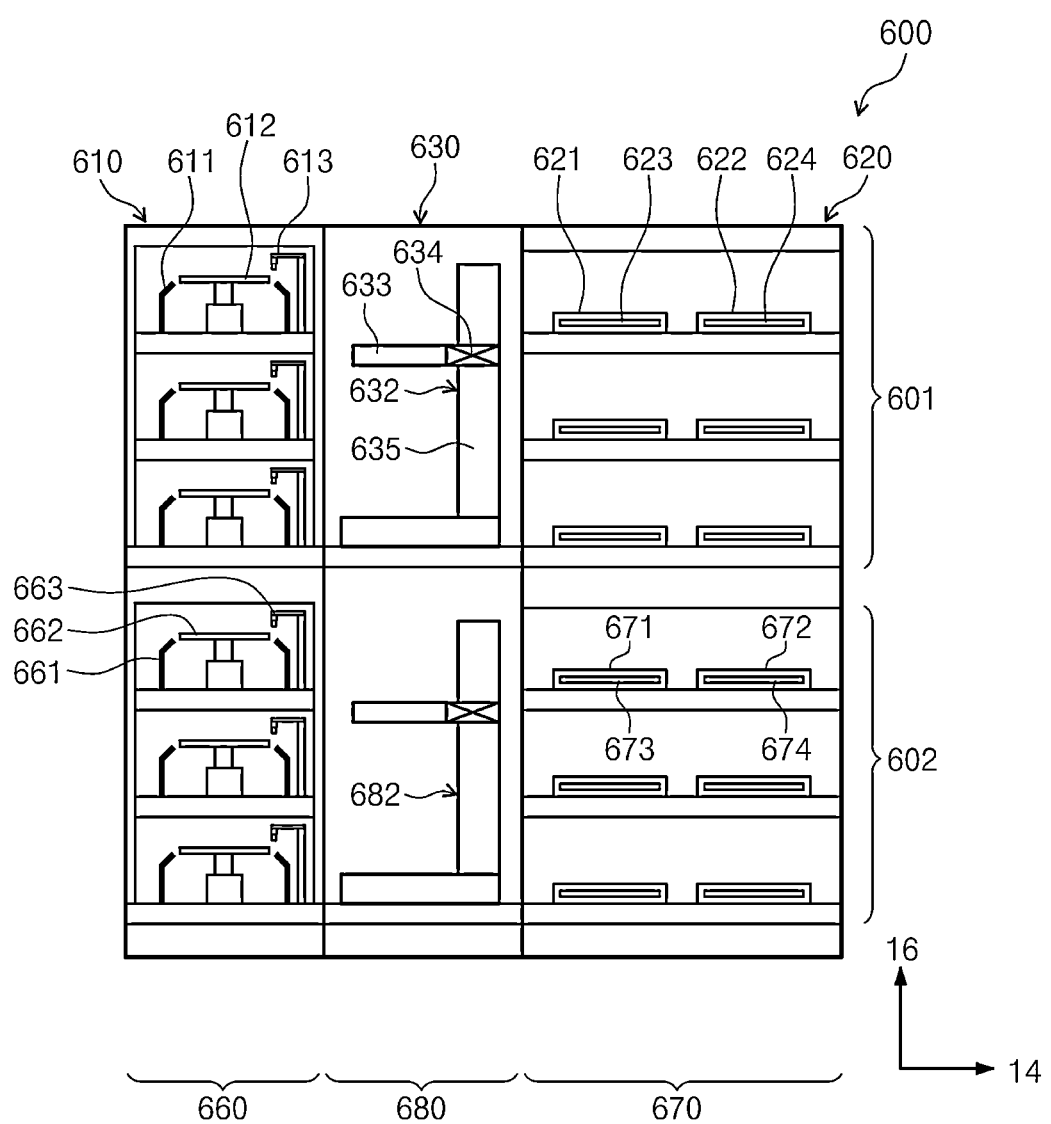
FIG. 4 is a cross-sectional view of the apparatus of FIG. 1 viewed from a direction C-C.

FIG. 1 is a diagram of a substrate treating apparatus viewed from the top, FIG. 2 is a diagram of the apparatus of FIG. 1 viewed from a direction A-A, FIG. 3 is a diagram of the apparatus of FIG. 1 viewed from a direction B-B, and FIG. 4 is diagram of the apparatus of FIG. 1 viewed from a direction C-C.

Referring to FIGS. 1 to 4, a substrate treating apparatus 1 includes a load port 100, an index module 200, a first buffer module 300, a coating and developing module 400, a second buffer module 500, a pre post-exposure treating module 600, and an interface module 700. The bad port 100, the index module 200, the first buffer module 300, the coating and developing module 400, the second buffer module 500, the pre/post-exposure treating module 600, and the interface module 700 are sequentially arranged in a line in one direction.

Hereinafter, a direction in which the bad port 100, the index module 200, the first buffer module 300, the coating and developing module 400, the second buffer module 500, the pre/post-exposure treating module 600, and the interface module 700 are disposed is referred as a first direction 12, a direction perpendicular to the first direction 12 when viewed from the top is referred as a second direction 14, and a direction perpendicular to the first direction 12 and the second direction 14 is referred as a third direction 16.

A substrate W is moved while being received in a cassette 20. At this time, the cassette 20 has a structure that may be sealed from the outside. For example, as the cassette 20, a from open unified pod (FOUP) having a door at the front may be used.

Hereinafter, the load port 100, the index module 200, the first buffer module 300, the coating and developing module 400, the second buffer module 500, the pre/post-exposure treating module 600, and the interface module 700 will be described in detail.

The load port 100 has a mounting table 120 on which the cassette 20 in which the substrates W are received is placed. A plurality of mounting tables 120 are provided and arranged in a line along the second direction 14. In FIG. 2, four mounting tables 120 are provided.

The index module 200 transfers the substrate W between the cassette 20 placed on the mounting table 120 of the load port 100 and the first buffer module 300. The index module 200 includes a frame 210, an index robot 220, and a guide rail 230. The frame 210 is provided in a substantially hollow rectangular parallelepiped shape, and is disposed between the load port 100 and the first buffer module 300. The frame 210 of the index module 200 may be provided at a lower height than the frame 310 of the first buffer module 300 to be described below. The index robot 220 and the guide rail 230 are disposed in the frame 210. The index robot 220 has a 4-axis drivable structure so that a hand 221 for directly handing the substrate W may be movably rotated in the first direction 12, the second direction 14, and the third direction 16. The index robot 220 has a hand 221, an arm 222, a support 223, and a holder 224. The hand 221 is fixed to the arm 222. The arm 222 is provided in an extendible structure and a rotatable structure. The longitudinal direction of the support 223 is disposed along the third direction 16. The arm 222 is coupled to the support 223 to be movable along the support 223. The support 223 is fixedly coupled to the holder 224. The guide rail 230 is provided so that the longitudinal direction thereof is disposed along the second direction 14. The holder 224 is coupled to the guide rail 230 so as to be linearly movable along the guide rail 230. In addition, although not illustrated, the frame 210 is further provided with a door opener for opening and closing the door of the cassette 20.

The first buffer module 300 includes a frame 310, a first buffer 320, a second buffer 330, a cooling chamber 350, and a first buffer robot 360. The frame 310 is provided in a hollow rectangular parallelepiped shape, and is disposed between the index module 200 and the coating and developing module 400. The first buffer 320, the second buffer 330, the cooling chamber 350, and the first buffer robot 360 are positioned in the frame 310. The cooling chamber 350, the second buffer 330, and the first buffer 320 are disposed along the third direction 16 sequentially from the bottom. The first buffer 320 is positioned at a height corresponding to a coating module 401 of the coating and developing module 400 to be described below, and the second buffer 330 and the cooling chamber 350 are positioned at a height corresponding to a developing module 402 of the coating and developing module 400 to be described below. The first buffer robot 360 is spaced apart from the second buffer 330, the cooling chamber 350, and the first buffer 320 at a predetermined distance in the second direction 14.

The first buffer 320 and the second buffer 330 temporarily store the plurality of substrates W, respectively. The second buffer 330 has a housing 331 and a plurality of supports 332. The supports 332 are disposed in the housing 331 and are provided to be spaced apart from each other along the third direction 16. One substrate W is placed on each support 332. The housing 331 has openings (not illustrated) in a direction in which the index robot 220 is provided, a direction in which the fast buffer robot 360 is provided, and a direction in which a developing robot 482 is provided so that the index robot 220, the first buffer robot 360, and the developing robot 482 of the developing module 402 to be described below carry in or out the substrate W to the support 332 in the housing 331. The first buffer 320 has a structure substantially similar to the second buffer 330. However, the housing 321 of the first buffer 320 has an opening in the direction in which the first buffer robot 360 is provided and in the direction in which a coating robot 432 positioned in the coating module 401 to be described below is provided. The number of supports 322 provided in the first buffer 320 and the number of supports 332 provided in the second buffer 330 may be the same as or different from each other. According to the exemplary embodiment, the number of supports 332 provided in the second buffer 330 may be greater than the number of supports 322 provided in the first buffer 320.

The first buffer robot 360 transfers the substrate W between the first buffer 320 and the second buffer 330. The first buffer robot 360 has a hand 361, an arm 362, and a support 363. The hand 361 is fixed to the arm 362. The arm 362 is provided in an extendible structure, so that the hand 361 is movable along the second direction 14. The arm 362 is coupled to the support 363 to be linearly movable along the support 363 in the third direction 16. The support 363 has a length extending from a position corresponding to the second buffer 330 to a position corresponding to the first buffer 320. The support 363 may be provided longer than the length upward or downward. The first buffer robot 360 may simply be provided so that the hand 361 is only biaxially driven along the second direction 14 and the third direction 16.

The cooling chamber 350 cools the substrate W. The cooling chamber 350 has a housing 351 and a cooling plate 352. The cooling plate 352 has a cooling means 353 for cooling the upper surface on which the substrate W is placed and the substrate W. As the cooling means 353, various methods such as cooling by a coolant, cooling using a thermoelectric element, and the like may be used. In addition, a lift pin assembly (not illustrated) for positioning the substrate W on the cooling plate 352 may be provided in the cooling chamber 350. The housing 351 has openings (not illustrated) in a direction in which the index robot 220 is provided and a direction in which a developing robot 482 is provided, so that the index robot 220 and the developing robot 482 provided in the developing module 402 to be described below may carry in or out the substrate W to the cooling plate 352. In addition, doors (not illustrated) for opening and closing the above-described openings may be provided in the cooling chamber 350.

The coating and developing module 400 performs a process of coating a photoresist on the substrate W before the exposure process and a process of developing the substrate W after the exposure process. The coating and developing module 400 generally has a substantially rectangular parallelepiped shape. The coating and developing module 400 has a coating module 401 and a developing module 402. The coating module 401 and the developing module 402 are disposed to be partitioned from each other in layers. According to the exemplary embodiment, the coating module 401 is positioned above the developing module 402.

The coating module 401 includes a process of coating a photosensitive liquid such as a photosensitive liquid to the substrate W and a heat treatment process such as heating and cooling the substrate W before and after the resist coating process. The coating module 401 has a resist coating chamber 410, a bake chamber 420, and a transfer chamber 430. The resist coating chamber 410, the bake chamber 420, and the transfer chamber 430 are disposed sequentially along the second direction 14. Accordingly, the resist coating chamber 410 and the bake chamber 420 are spaced apart from each other in the second direction 14 with the transfer chamber 430 interposed therebetween. A plurality of resist coating chambers 410 are provided, and a plurality of resist coating chambers are provided in the first direction 12 and the third direction 16, respectively. In the drawing, an example in which six resist coating chambers 410 are provided is illustrated. A plurality of bake chambers 420 are provided in the first direction 12 and the third direction 16, respectively. In the drawing, an example in which six bake chambers 420 are provided is illustrated. However, unlike this, a larger number of the bake chambers 420 may be provided.

The transfer chamber 430 is positioned in parallel with the first buffer 320 of the first buffer module 300 in the first direction 12. A coating robot 432 and a guide rail 433 are positioned in the transfer chamber 430. The transfer chamber 430 has a substantially rectangular shape. The coating robot 432 transfers the substrate W between the bake chambers 420, the resist coating chambers 400, the first buffer 320 of the first buffer module 300, and a first cooling chamber 530 of the second buffer 500 to be described below. The guide rail 433 is disposed so that the longitudinal direction thereof is in parallel with the first direction 12. The guide rail 433 guides the coating robot 432 to move linearly in the first direction 12. The coating robot 432 has a hand 434, an arm 435, a support 436, and a holder 437. The hand 434 is fixed to the arm 435. The arm 435 is provided in an extendible structure so that the hand 434 is movable in a horizontal direction. The support 436 is provided so that the longitudinal direction thereof is disposed along the third direction 16. The arm 435 is coupled to the support 436 to be linearly movable along the support 436 in the third direction 16. The support 436 is fixedly coupled to the holder 437, and the holder 437 is coupled to the guide rail 433 to be movable along the guide rail 433.

The resist coating chambers 410 all have the same structure. However, types of photoresists used in each resist coating chamber 410 may be different from each other. As an example, a chemical amplification resist may be used as the photoresist. The resist coating chamber 410 is provided as the substrate treating apparatus for coating the photoresist on the substrate W. A substrate treating apparatus 800 performs a liquid coating process.

Figure 5:
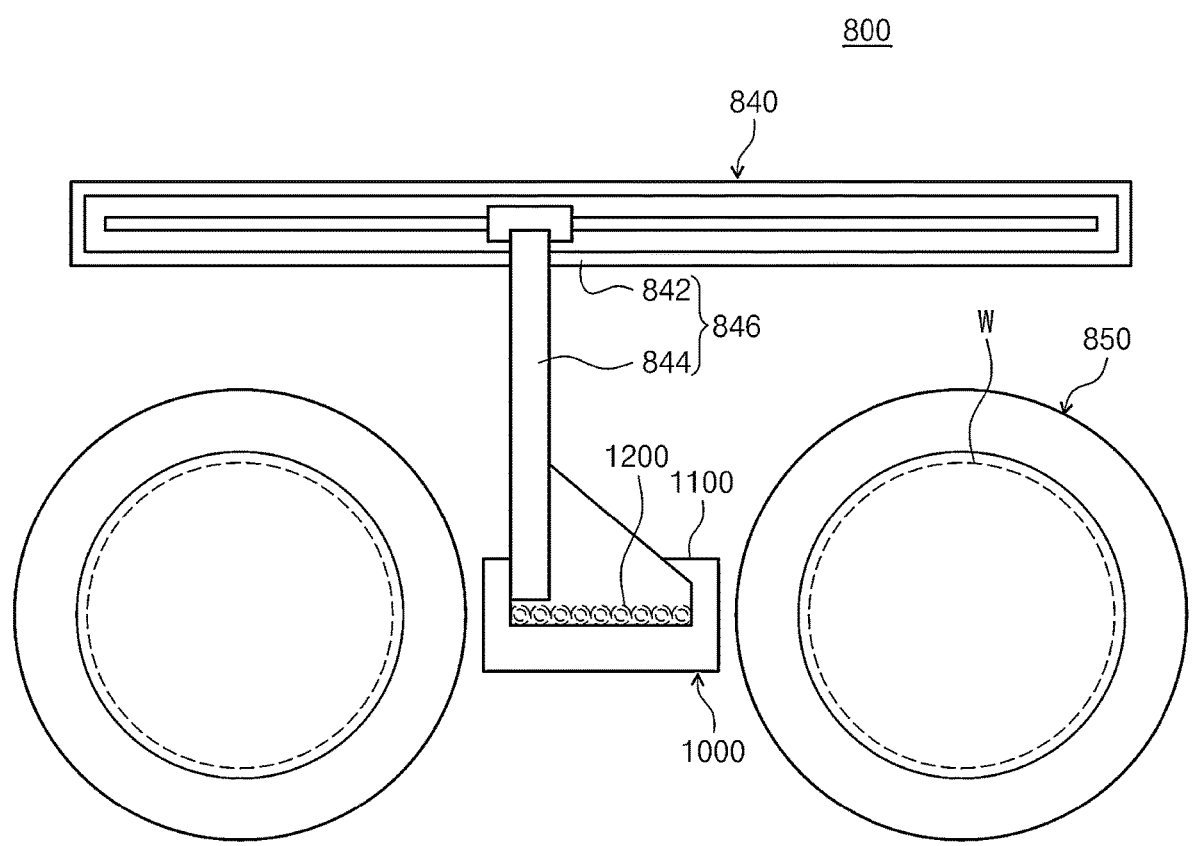
FIG. 5 is a plan view illustrating the substrate treating apparatus of FIG. 1.
Figure 6:
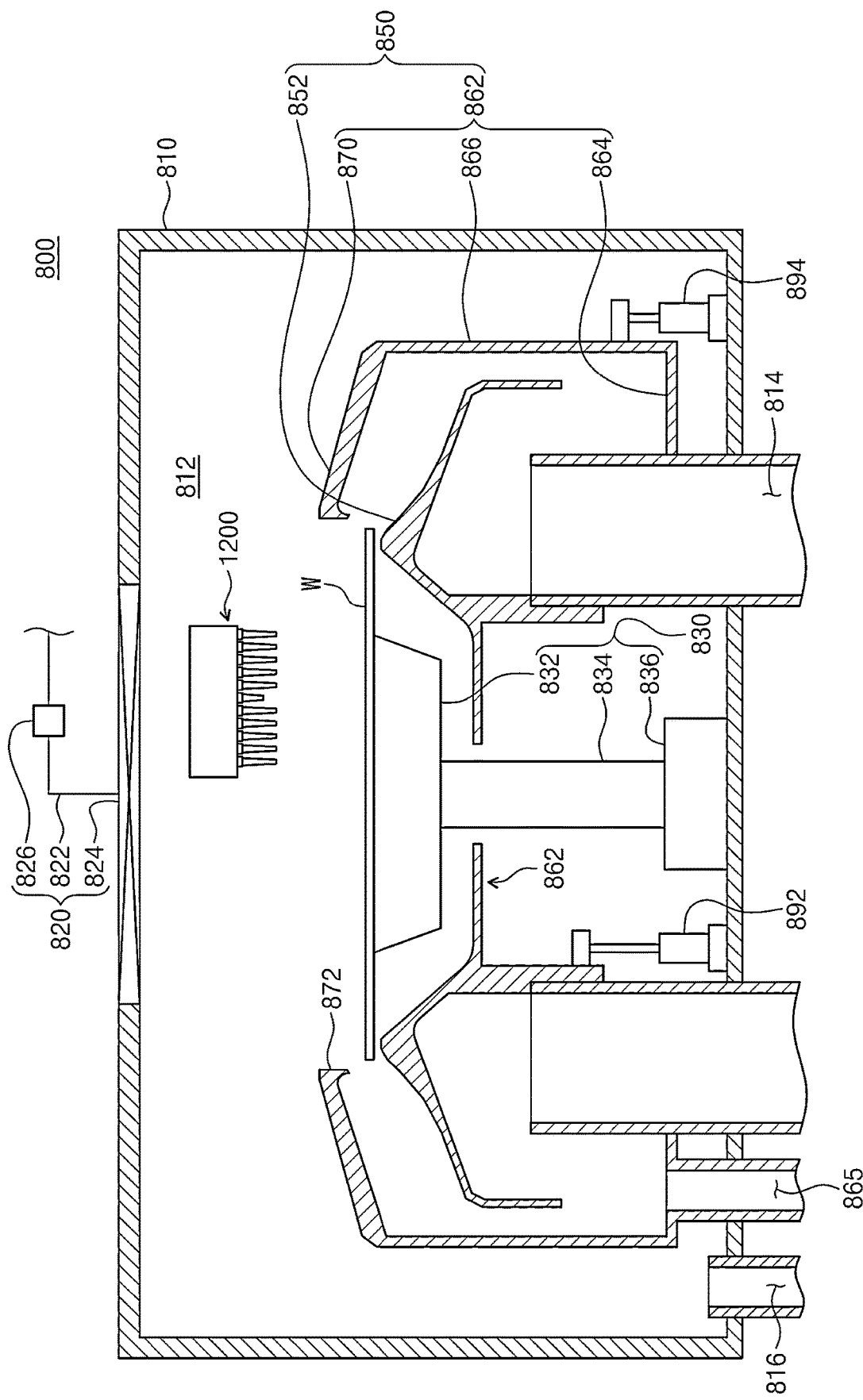
FIG. 6 is a cross-sectional view illustrating the substrate treating apparatus of FIG. 1.

FIG. 5 is a plan view illustrating the substrate treating apparatus of FIG. 1 and FIG. 6 is a cross-sectional view illustrating the substrate treating apparatus of FIG. 1. Referring to FIGS. 5 and 6, the substrate treating apparatus 800 includes a housing 810, an airflow providing unit 820, a substrate support unit 830, a treatment container 850, an elevation unit 890, a liquid supply unit 840, and a nozzle standby port 1000.

The housing 810 is provided in a rectangular cylindrical shape having a treating space 812 therein. An opening (not illustrated) is formed at one side of the housing 810. The opening functions as an inlet through which the substrate W is carried in and out. A door (not illustrated) is installed in the opening, and the door opens and closes the opening. When the substrate treating process is performed, the door closes the treating space 812 of the housing 810 by blocking the opening. An inner exhaust port 814 and an outer exhaust port 816 are formed on the lower surface of the housing 810. The air flow formed in the housing 810 is exhausted to the outside through the inner exhaust port 814 and the outer exhaust port 816. According to the exemplary embodiment, the airflow introduced into the treating container 850 may be exhausted through the inner exhaust port 814, and the airflow provided outside the treating container 850 may be exhausted through the outer exhaust port 816.

The airflow providing unit 820 forms a down flow in the treating space 812 of the housing 810. The airflow providing unit 820 includes an airflow supply line 822, a fan 824, and a filter 826. The airflow supply line 822 is connected to the housing 810, The airflow supply line 822 supplies external clean air to the housing 810. The filter 826 filters the clean air provided from the airflow supply line 822. The filter 826 removes impurities contained in the air. The fan 824 is provided on the upper surface of the housing 810, The fan 824 is positioned in a central region on the upper surface of the housing 810. The fan 824 forms a downflow in the treating space 812 of the housing 810. When the clean air is supplied to the fan 824 from the airflow supply line 822, the fan 824 supplies the clean air downward. According to the exemplary embodiment, the fan 824 may supply airflows having different flow rates to the treating space according to a substrate treating step.

The substrate support unit 830 may support the substrate W in the treating space 812 of the housing 810. The substrate support unit 830 rotates the substrate W. The substrate support unit 830 includes a spin chuck 832, a rotation shaft 834, and a driver 836. The spin chuck 832 serves as a substrate support member 832 for supporting the substrate. The spin chuck 832 is provided to have a circular plate shape. The substrate W is in contact with the upper surface of the spin chuck 832. The spin chuck 832 is provided to have a smaller diameter than the substrate W. According to the exemplary embodiment, the spin chuck 832 may chuck the substrate W by vacuum-suctioning the substrate W. Optionally, the spin chuck 832 may be provided as an electrostatic chuck for chucking the substrate W using static electricity. In addition, the spin chuck 832 may chuck the substrate W with a physical force.

The rotation shaft 834 and the driver 836 are provided as rotation driving members 834 and 836 for rotating the spin chuck 832. The rotation shaft 834 supports the spin chuck 832 below the spin chuck 832. The rotation shaft 834 is provided so that the longitudinal direction thereof faces a vertical direction. The rotation shaft 834 is provided to be rotatable around its central axis. The driver 836 provides a driving force to rotate the rotation shaft 834. For example, the driver 836 may be a motor capable of varying the rotation speed of the rotation shaft. The rotation driving members 834 and 836 may rotate the spin chuck 832 at different rotation speeds depending on the substrate treating step.

The treating container 850 is positioned in the treating space 812 of the housing 810, The treating container 850 is provided to cover the substrate support unit 830. The treating container 850 is provided to have a cup shape of which the upper portion is opened. The treating container 850 includes an inner cup 852 and an outer cup 862.

The inner cup 852 is provided in a circular cup shape covering the rotation shaft 834. When viewed from the top, the inner cup 852 is positioned to overlap with the inner exhaust port 814. When viewed from the top, the upper surface of the inner cup 852 is provided such that the outer and inner regions are inclined at different angles, respectively. According to the exemplary embodiment, the outer region of the inner cup 852 faces a downward-inclined direction as faraway from the substrate support unit 830, and the inner region of the inner cup 852 faces an upward-inclined direction as faraway from the substrate support unit 830. A point where the outer region and the inner region of the inner cup 852 meet each other is provided to correspond to the side end of the substrate W in the vertical direction. The outer region of the upper surface of the inner cup 852 is provided to be rounded. The outer region of tire upper surface of the inner cup 852 is provided to be concave downwards. The outer region of the upper surface of the inner cup 852 may be provided as a region through which the treating liquid flows.

The outer cup 862 is provided to have a cup shape covering the substrate support unit 830 and the inner cup 852. The outer cup 862 has a bottom wall 864, a side wall 866, an upper wall 872, and an inclined wall 870. The bottom wall 864 is provided to have a hollow circular plate shape. A recovery line 865 is formed in the bottom wall 864. The recovery line 865 recovers the treating liquid supplied onto the substrate W. The treating liquid recovered by the recovery line 865 may be reused by an external liquid regeneration system. The side wall 866 is provided to have a circular cylindrical shape covering the substrate support unit 830. The side wall 866 extends in a direction perpendicular to the side end of the bottom wall 864. The side wall 866 extends upward from the bottom wall 864.

The inclined wall 870 extends toward the inside of the outer cup 862 from the upper end of the side wall 866. The inclined wall 870 is provided to be closer to the substrate support unit 830 upwards. The inclined wall 870 is provided to have a ring shape. The upper end of the inclined wall 870 is positioned higher than the substrate W supported by the substrate support unit 830.

The elevation unit 890 elevates the inner cup 852 and the outer cup 862, respectively. The elevation unit 890 includes an inner moving member 892 and an outer moving member 894. The inner moving member 892 elevates the inner cup 852 and the outer moving number 894 elevates the outer cup 862.

The liquid supply unit 840 supplies a photosensitive liquid and a pre-wetting liquid onto the substrate W. The liquid supply unit 840 includes a moving member 846 and a nozzle unit 1200. The moving member 846 moves the nozzle unit 1200 to a process position or to a standby position. Here, the process position is a position where the nozzle unit 1200 faces the substrate W supported by the substrate support unit 830, and the standby position is a position out of the process position. For example, in the process position, the nozzle unit 1200 and the substrate W may be positioned to face each other in a vertical direction.

The moving member 846 moves the nozzle unit 1200 in one direction. According to the exemplary embodiment, the moving member 846 may linearly move the nozzle unit 1200 in one direction. One direction may be a direction parallel to the first direction 12. The moving member 846 includes a guide rail 842 and an arm 844. The guide rail 842 is provided so that the longitudinal direction faces a horizontal direction. The guide rail 842 may have a longitudinal direction facing the first direction 12. The guide rail 842 is positioned on one side of the treating container 850. The arm 844 is provided on the guide rail 842. The arm 844 is moved for a driving member (not illustrated) provided in the guide rail 842. For example, the driving member may be a linear motor. The arm 844 is provided in a bar shape having a longitudinal direction perpendicular to the guide rail 842 when viewed from the top. The nozzle unit 1200 is provided on the bottom surface of the end of the arm 844. The nozzle unit 1200 is moved together with the arm 844.

Figure 7:
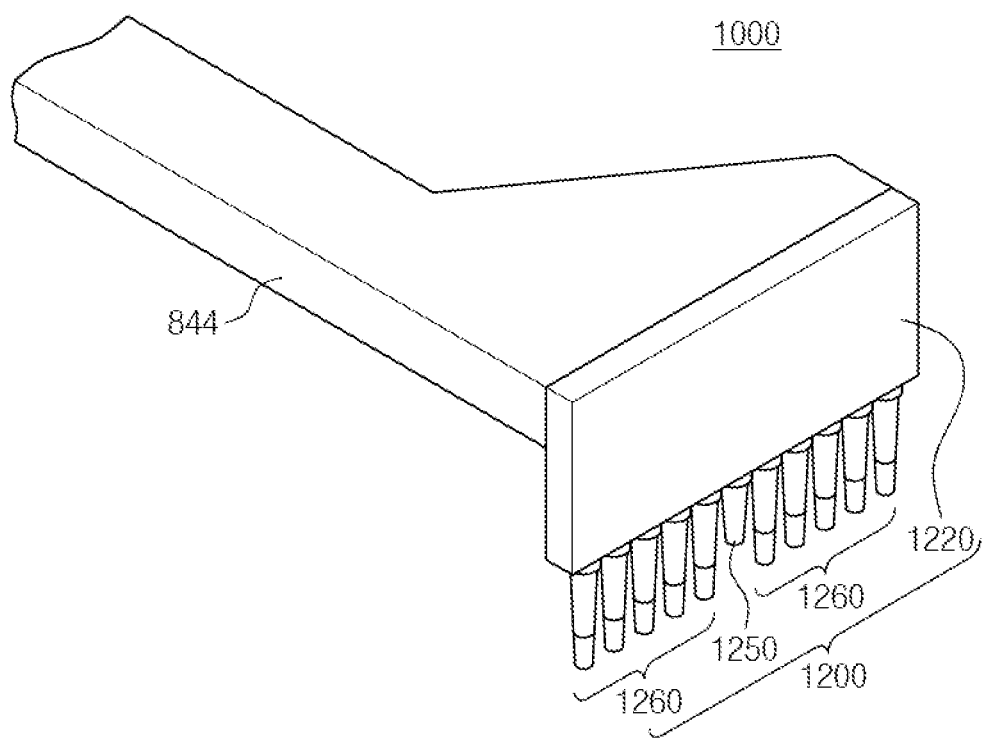
FIG. 7 is an enlarged perspective view illustrating a nozzle unit of FIG. 6.

FIG. 7 is art enlarged perspective view illustrating a nozzle unit of FIG. 6. Referring to FIG. 7, the nozzle unit 1200 ejects a photosensitive liquid and a pre-wetting liquid. The nozzle unit 1200 includes a support body 1220, a pre-wetting liquid supply nozzle 1250, and a treating liquid supply nozzle 1260. The support body 1220 simultaneously supports the pre-wetting liquid supply nozzle 1250 and the treating liquid supply nozzle 1260. Each of the nozzles 1250 and 1260 is provided so that an ejection hole vertically heads downward. When viewed from the top, the pre-wetting liquid supply nozzle 1250 and the treating liquid supply nozzle 1260 are arranged in a direction parallel to the moving direction of the nozzle unit 1200. According to the exemplary embodiment, the pre-wetting liquid supply nozzle 1250 and the treating liquid supply nozzle 1260 may be arranged in a line along one direction which is the moving direction of the nozzle unit 1200. A plurality of treating liquid supply nozzles 1260 is provided. In the exemplary embodiment, the plurality of treating liquid supply nozzles 1260 may be arranged along one direction with the pre-wetting liquid supply nozzle 1250 interposed therebetween. That is, the plurality of treating liquid supply nozzles 1260, the pre-wetting liquid supply nozzle 1250, and the plurality of treating liquid supply nozzles 1260 may be positioned in a line with respect to the moving direction of the nozzle unit 1200.

The pre-wetting liquid supply nozzle 1250 ejects the pre-wetting liquid. The pre-wetting liquid may be provided as a liquid having a property of hydrophilicity and hydrophobicity close to the photosensitive liquid. In the exemplary embodiment, when the photosensitive liquid has the hydrophobicity, the pre-wetting liquid may be provided as a thinner. The pre-wetting liquid may increase the adhesion between the substrate W and the photosensitive liquid.

In the exemplary embodiment, a plurality of treating liquid supply nozzles 1260 ejects the photosensitive liquid. In the exemplary embodiment, the photosensitive liquid is provided as a photoresist. In the exemplary embodiment, each of the treating liquid supply nozzles 1260 ejects the same flow rate of photosensitive liquid. According to the exemplary embodiment, a plurality of treating liquid supply nozzles 1260 are provided on one side of the pre-wetting liquid supply nozzle 1250 with respect to the pre-wetting liquid supply nozzle 1250, and a plurality of treating liquid supply nozzles 1260 may be provided on the other side opposite thereto. The same number of treating liquid supply nozzles 1260 may be symmetrically arranged on both sides of the pre-wetting liquid supply nozzle 1250, respectively. The respective treating liquid supply nozzles 1260 may eject different types of photosensitive liquids. For example, during the process of treating a single substrate W, one of the plurality of treating liquid supply nozzles 1260 may eject the photosensitive liquid. The pre-wetting liquid supply nozzle 1250 has an ejection end positioned higher than that of the treating liquid supply nozzles 1260. This is to prevent the photosensitive liquid from scattering and adhering to the pre-wetting liquid supply nozzle 1250 while the photosensitive liquid is ejected.

The nozzle standby port 1000 provides a standby space where the nozzle unit 1200 stands by before and after treating the substrate W in the treating space 812. In the exemplary embodiment, the nozzle standby port 1000 is positioned outside the treating space 812. A controller holds the nozzle unit 1200 by moving the nozzle unit 1200 to a position corresponding to the nozzle standby port 1000 before the nozzle unit 1200 supplies the liquid onto the substrate W. In the exemplary embodiment, the nozzle unit 1200 may be cleaned while positioned in the standby space. For example, the treating liquid supply nozzle 1260 is cleaned while being positioned in the standby space. The nozzle standby port 1000 has a spray member 1205 for cleaning the treating liquid supply nozzle 1260. The spray member 1205 sprays the cleaning liquid to the nozzle tip of the treating liquid supply nozzle 1260 to clean the nozzle tip. In the exemplary embodiment, the cleaning liquid is provided as a thinner.

Figure 8:
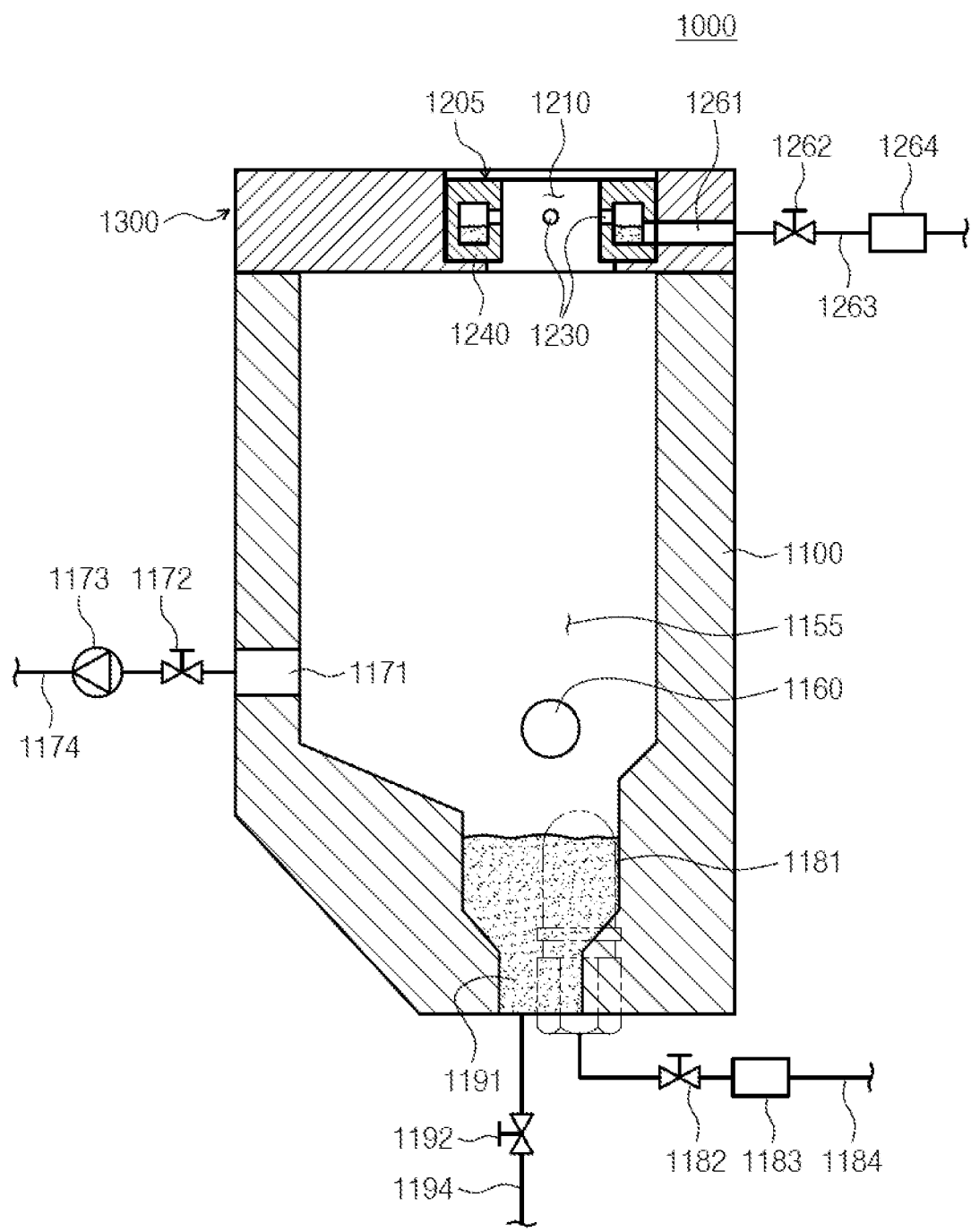
FIG. 8 is a cross-sectional view, illustrating a nozzle standby port of FIG. 5.
Figure 9:
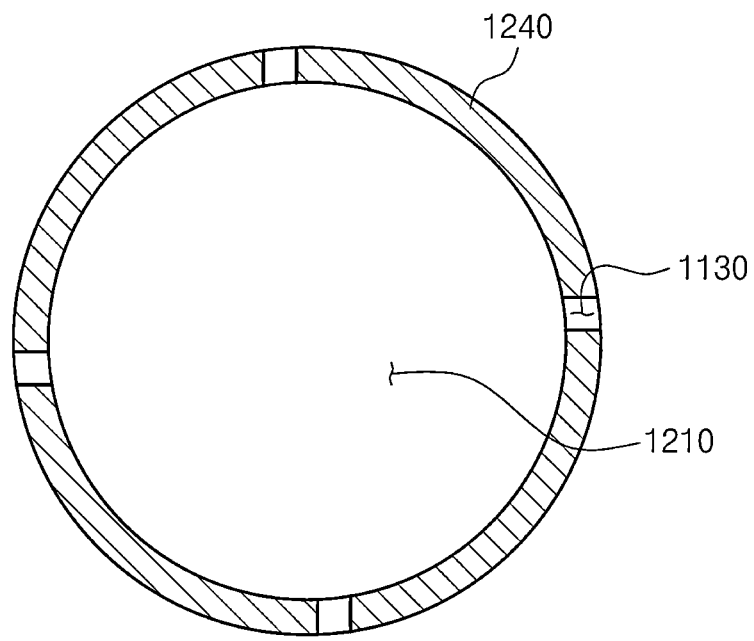
FIG. 9 is an enlarged cross-sectional view illustrating an insertion hole of FIG. 8.

Hereinafter, the nozzle standby port 1000 of the present disclosure will be described in detail with reference to FIGS. 8 to 15. FIG. 8 is a cross-sectional view illustrating the nozzle standby port 1000 of FIG. 5 and FIG. 9 is an enlarged cross-sectional view illustrating an insertion hole 1210 of FIG. 8. Referring to FIGS. 8 to 9, the nozzle standby port 1000 includes an insertion hole 1210, a spray member 1205, a cover 1300, and a liquid tank 1100. As shown in FIG. 8, the spray member 1205 is embedded in the cover 1300 above an upper surface of the liquid tank 1100.

The insertion hole 1210 is provided so that the nozzle tip of the treating liquid supply nozzle 1260 is insertable. The insertion hole 1210 is provided with a larger diameter than the nozzle tip. The spray member 1205 sprays the cleaning liquid to the nozzle tip inserted into the insertion hole 1210.

In the exemplary embodiment, the spray member 1205 has a container 1240. The container 1240 receives and stores the cleaning liquid from a cleaning liquid supply source 1264. The 1240 is connected with the cleaning liquid supply source 1264 by a cleaning liquid supply line 1263. A cleaning liquid valve 1262 is provided in the cleaning liquid supply line 1263. The cleaning liquid valve 1262 controls a supply and a supply amount of the cleaning liquid to be supplied to the container 1240. In the exemplary embodiment, the container 1240 is provided in a ring shape surrounding the insertion hole 1210.

An ejection hole 1230 is provided in the container 1240. The ejection hole 1230 is provided to eject the cleaning liquid when a predetermined level of the cleaning liquid is supplied to the container 1240. The ejection hole 1230 is formed to pass through the container 1240. In the exemplary embodiment, a plurality of ejection holes 1230 may be provided so as to surround the nozzle tip inserted into insertion hole 1210. The ejection hole 1230 is provided at a predetermined height of the container 1240. A cleaning liquid supply pipe 1261 connecting the cleaning liquid supply line 1263 and the container 1240 is provided at a lower position than the ejection hole 1230. Accordingly, the cleaning liquid flowing into the container 1240 through the cleaning liquid supply pipe 1261 is stored in the container 1240 up to a predetermined level and then ejected through the ejection hole 1230 when the cleaning liquid in the container 1240 fills up to the height at which the ejection hole 1230 is formed.

In the exemplary embodiment, a plurality of ejection holes 1230 is provided. Each of the ejection holes 1230 may be provided at the same height. Accordingly, the timing at which the cleaning liquid is ejected through the ejection hole 1230 is the same, and the pressure of the cleaning liquid ejected through the ejection hole 1230 is equally provided. Accordingly, there is an advantage in that it is necessary to only adjust the flow rate of the cleaning liquid provided to the cleaning liquid supply line 1263, and there is no need to separately provide a device for individually providing the same pressure of the cleaning liquid at each ejection hole 1230. The ejection holes 1230 may be positioned at the same height, but may be provided at different heights if necessary.

In the exemplary embodiment, the ejection holes 1230 are provided to be spaced apart from each other at the same angle. In the exemplary embodiment, four ejection holes 1230 may be provided at 45° intervals based on the center point of the insertion hole 1210. Optionally, the number of ejection holes 1230 may be provided larger or smaller therethan at smaller or larger intervals therethan.

The cleaning liquid sprayed by the spray member 1205 is accommodated in the liquid tank 1100. An exhaust pipe 1171, a discharge pipe 1101, and a circulation pipe 1181 are provided in the liquid tank 1100.

The exhaust pipe 1171 exhausts an atmosphere in an interior 1155 of the liquid tank 1100. Fume and the like generated in the interior 1155 of the liquid tank 1100 is discharged to the outside by the exhaust pipe 1171, and the exhaust line 1174 is connected to the exhaust pipe 1171. The exhaust line 1174 is provided with a decompression member 1173 and an exhaust valve 1172. The decompression member 1173 depressurizes the liquid tank 1100 so that the atmosphere in the liquid tank 1100 may be exhausted. The exhaust valve 1172 adjusts the exhaustion and the exhaust flow rate of the decompression member 1173.

The discharge pipe 1191 discharges the liquid contained in the liquid tank 1100 to the outside. A discharge line 1194 is connected to the discharge pipe 1191. A discharge valve 1192 is provided in the discharge line 1194. In the exemplary embodiment, the liquid accommodated in the liquid tank 1100 is naturally discharged through the discharge line 1194. The discharge valve 1192 controls whether the liquid contained in the liquid tank 1100 is discharged.

The circulation pipe 1181 circulates the liquid accommodated in the liquid tank 1100. In the exemplary embodiment, a circulation liquid is supplied from a circulation liquid supply source 1183 through the circulation pipe 1181. In the exemplary embodiment, the circulation liquid is supplied as the cleaning liquid. The cleaning liquid is supplied through the circulation pipe 1181 and the cleaning liquid is discharged through the discharge pipe 1191 to prevent the liquid in the liquid tank 1100 from being hardened or evaporated so that the level is lower than a predetermined level. The circulation line 1184 supplies the circulation liquid from the circulation liquid supply source 1183 to the circulation pipe 1181. A circulation valve 1182 is provided in the circulation line 1184. The circulation valve 1182 controls whether or not the circulation liquid supplied to the circulation pipe 1181 is supplied and a supply flow rate thereof.

A dispersion member 1160 is provided in the liquid tank 1100. The dispersion member 1160 is positioned below the insertion hole 1210. The dispersion member 1160 is provided to prevent the cleaning liquid dropping from the nozzle tip inserted into the insertion hole 1210 from directly dropping into the cleaning liquid filled in the liquid tank 1100. When the cleaning liquid dropping from the nozzle directly drops into the cleaning liquid filled in the liquid tank 1100, the cleaning liquid that has been filled by the droplets of the dropping cleaning liquid splashes up to contaminate the inside of the liquid tank 1100 and the nozzle tip.

The dispersion member 1160 reduces the size of the droplets while the cleaning liquid dropping from the nozzle tip collides with the dispersion member 1160 to prevent the cleaning liquid filled in the liquid tank 1100 from splashing and the droplets lose the kinetic energy in the process of colliding with the dispersion member 1160 to prevent the cleaning liquid from splashing out. Accordingly, it is possible to prevent the cleaning liquid separated from the nozzle tip from splashing to contaminates the nozzle tip and the inside of the liquid lank 1100. In the exemplary embodiment, the dispersion member 1160 may be positioned below the exhaust pipe 1171. Accordingly, even if the cleaning liquid splashes by the dispersion member 1160, the cleaning liquid may be discharged to the outside through the exhaust port.

In the exemplary embodiment, as illustrated in FIG. 8, the dispersion member 1160 may be provided in a spherical shape. Accordingly, the cleaning liquid colliding with the upper surface of the dispersion member 1160 may flow down along the dispersion member 1160.

Figure 10:
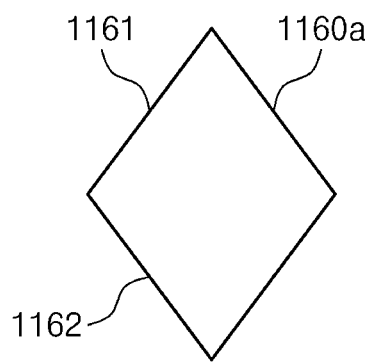
FIGS. 10 to 11 are plan views illustrating a dispersion member according to another exemplary embodiment of the present disclosure, respectively.
Figure 11:
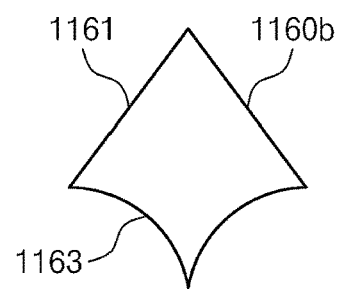

Optionally, the upper surface of the dispersion member 1160 may be provided to be inclined downward as illustrated in FIGS. 10 and 11. In the exemplary embodiment, the cross section of a dispersion member 1160*a* may be provided in a diamond shape as illustrated in FIG. 10. Accordingly, the cleaning liquid colliding with the upper surface 1161 of the dispersion member 1160*a* scatters on the dispersion member 1160 and flows downward along the dispersion member 1160, and may drop down along a lower surface 1162 of the dispersion member 1160 to induce the flow of cleaning liquid.

In the exemplary embodiment, a concave portion 1163 as illustrated in FIG. 11 may be formed on a lower surface of a dispersion member 1160*b*. The cleaning liquid colliding with the upper surface 1161 of the dispersion member 1160*b* scatters on the dispersion member 1160*b* and flows downward a tone the dispersion member 1160*b*. Thereafter, the cleaning liquid flows down along the lower surface of the dispersion member 1160*b*. The concave portion 1163 is provided on the lower surface of the dispersion member 1160*b*, so that even if the cleaning liquid flowing down along the lower surface of the dispersion member 1160*b* splashes up to the dispersion member 1160 again, the cleaning liquid may flow down along the concave portion 1163.

Figure 12:
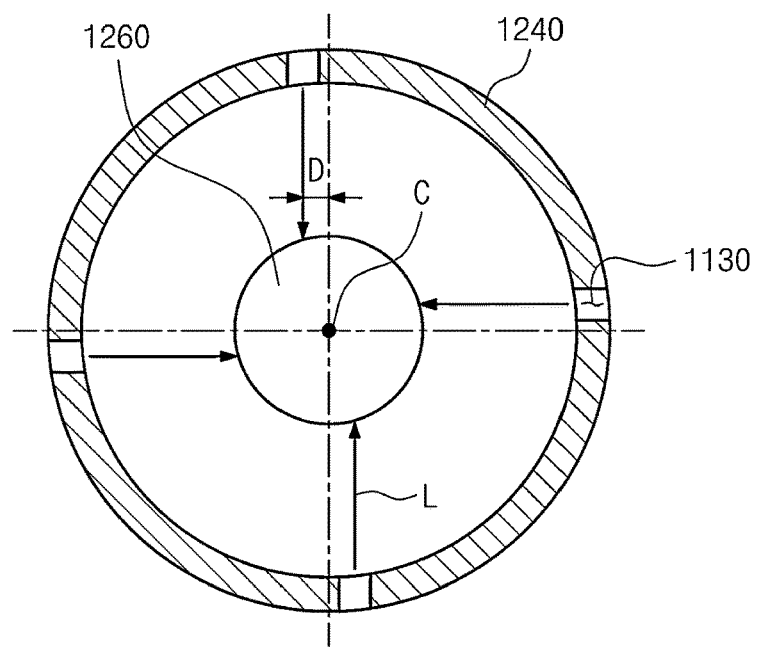
FIG. 12 is a cross-sectional view illustrating a state where a cleaning liquid is sprayed from a nozzle lip inserted to the insertion hole of FIG. 8.
Figure 13:
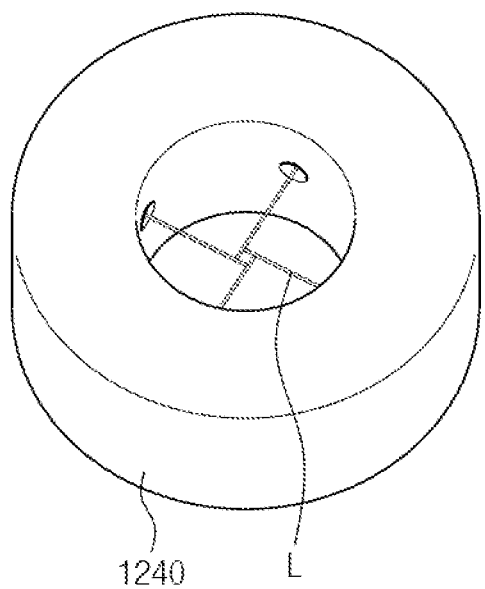
FIG. 13 is a drawing showing a state where the cleaning liquid is sprayed from a spray member of FIG. 6.
Figure 14:
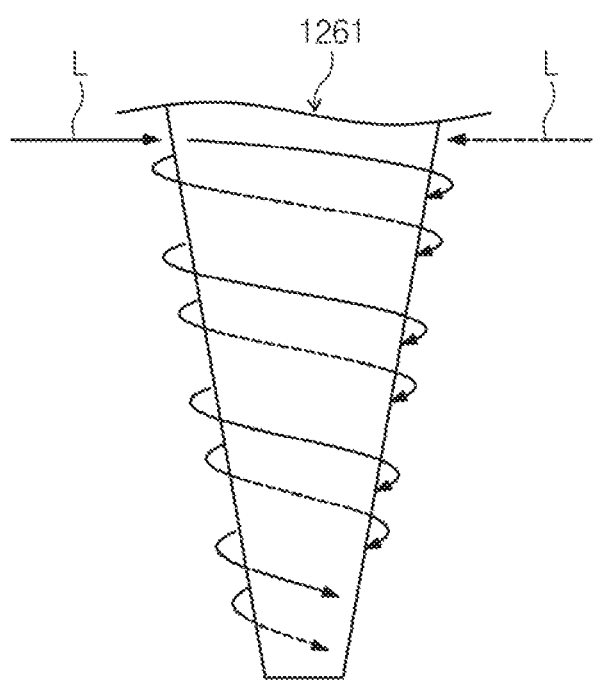
FIG. 14 is a plan view illustrating a state where the cleaning liquid sprayed from the spray member of FIG. 6 flows along the nozzle tip.

In the exemplary embodiment, an impact point of the cleaning liquid may be provided as a distance spaced apart from the center C of the nozzle tip 1261 by a predetermined distance. FIG. 12 is a cross-sectional view illustrating a state where a cleaning liquid is sprayed from the nozzle tip 1261 inserted to the insertion hole 1210 of FIG. 8, FIG. 13 is a drawing showing a state where the cleaning liquid is sprayed from the spray member 1205 of FIG. 6, and FIG. 14 is a plan view illustrating a state where the cleaning liquid sprayed front the spray member 1205 of FIG. 6 flows along the nozzle tip 1261.

Referring to FIG. 12, from the center C of the nuzzle tip 1261 inserted into the insertion hole 1210, a point at which the ejection hole 1230 impacts the cleaning liquid toward the nozzle tip 1261 is spaced apart by D. In the exemplary embodiment, points at which each ejection hole 1230 impacts the cleaning liquid toward the nozzle tip 1261 are equally spaced apart from each other by D. In the exemplary embodiment, points at which each ejection hole 1230 impacts the cleaning liquid toward the nozzle tip 1261 are spaced apart from the center C of the nozzle tip 1261 at the same angle. Referring to FIG. 13, the cleaning liquid sprayed from the ejection hole 1230 forms a grid at the center of the insertion hole 1210. In the exemplary embodiment, the larger the diameter of the nozzle tip, the further the predetermined distance may be provided. Referring to FIG. 14, the cleaning liquid sprayed from an exposure hole flows downward after colliding with the nozzle tip, and flows down spirally. Accordingly, there is an advantage that the outer surface of the nozzle tip is uniformly cleaned.

In the exemplary embodiment, the nozzle tip may be moved in the vertical direction while the spray member 1205 supplies the cleaning liquid toward the nozzle tip. In the exemplary embodiment, the nozzle tip may be rotated based on the center of the nozzle tip while the spray member 1205 supplies the cleaning liquid toward the nozzle tip.

Figure 15:
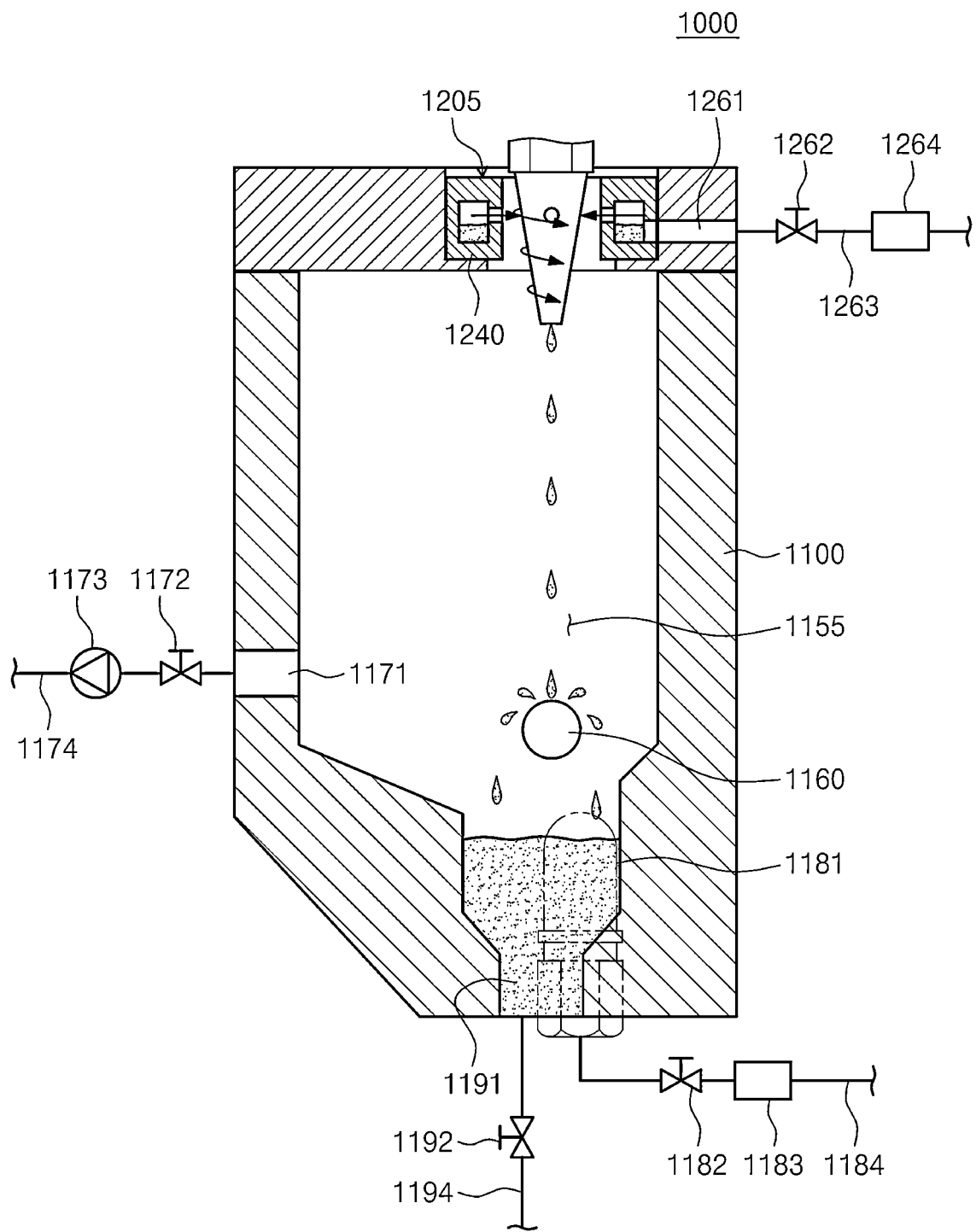
FIG. 15 is a cross-sectional view illustrating a nozzle cleaning method according to an exemplary embodiment of the present disclosure.

FIG. 15 is a cross-sectional view illustrating a nozzle cleaning method according to an exemplary embodiment of the present disclosure. The cleaning liquid is supplied to the cleaning liquid supply pipe 1261 before the nozzle tip is inserted into the insertion hole 1210. Accordingly, the cleaning liquid needs to be ejected from the ejection hole 1230 before the nozzle tip is inserted into the insertion port 1210. Optionally, the cleaning liquid may be supplied after the nozzle tip is inserted into the insertion hole 1210. The cleaning liquid ejected from the ejection hole 1230 cleans the outer surface of the nozzle tip. The cleaning liquid flows spirally along the nozzle tip. Thereafter, the cleaning liquid dropping from the nozzle tip loses energy by the dispersion member 1160. The cleaning liquid flows downward along the dispersion member 1160 to be accommodated in the liquid tank 1100.

According to the present disclosure, since the cleaning liquid is supplied in an overflow manner, there is an advantage in that it is not required to provide a pipe for supplying the cleaning liquid for each ejection hole 1230 in order to provide a plurality of ejection points.

According to the present disclosure, there is an advantage that the dispersion member 1160 is provided to prevent the cleaning liquid from splashing again in the liquid tank 1100.

According to the present disclosure, since the impact point of the cleaning liquid is spaced apart from the center point of the nozzle tip, the cleaning liquid colliding with the nozzle tip flows down spirally along the outer surface of the nozzle tip, thereby enhancing the cleaning range and the cleaning efficiency of the nozzle tip.

Referring back to FIGS. 1 to 4, the bake chamber 420 heat-treats the substrate W. For example, the bake chambers 420 perform a pre-bake process of heating the substrate W to a predetermined temperature before coating the photoresist to remove organic materials or moisture from the surface of the substrate W, a soft back process performed after coating the photoresist on the substrate W, and the like, and perform a cooling process of cooling the substrate W after each heating process, and the like. The bake chamber 420 has a cooling plate 421 or a heating plate 422. The cooling plate 421 is provided with a cooling means 423 such as a coolant or a thermoelectric element. In addition, the healing plate 422 is also provided with a heating means 424 such as a hot wire or thermoelectric element. The cooling plate 421 and the heating plate 422 may be provided in one bake chamber 420, respectively. Optionally, some of the bake chambers 420 may include only the cooling plate 421, and other bake chambers 420 may include only the heating plate 422.

The developing module 402 includes a developing process for removing apart of the photoresist by supplying a developer to obtain patterns on the substrate W, and a heat-treating process such as heating and cooling performed on the substrate W before and after the developing process. The developing module 402 includes a developing chamber 460, a bake chamber 470, and a transfer chamber 480. The developing chamber 460, the bike chamber 470, a ml the transfer chamber 480 are disposed sequentially along the second direction 14. Accordingly, the developing chamber 460 and the bake chamber 470 are spaced apart from each other in the second direction 14 with the transfer chamber 480 interposed therebetween. A plurality of developing chambers 460 are provided, and a plurality of developing chambers 460 are provided in the first direction 12 and the third direction 16, respectively. In the drawing, an example in which six developing clambers 460 are provided is illustrated. A plurality of bake chambers 470 are provided in the first direction 12 and the third direction 16, respectively. In the drawing, an example in which six hake chambers 470 are provided is illustrated. However, unlike this, a larger number of bake chambers 470 may be provided.

The transfer chamber 480 is positioned in parallel with the second buffer 330 of the first buffer module 300 in the first direction 12. A developing robot 482 and a guide rail 483 are positioned in the transfer chamber 480. The transfer chamber 480 has a substantially rectangular shape. The developing robot 482 transfers the substrate W among the bake chambers 470, the developing chambers 460, the second buffer 330 and the cooling chamber 350 of the first buffer module 300, and the second cooling chambers 540 of the second buffer module 500. The guide rail 483 is disposed so that the longitudinal direction thereof is in parallel with the first direction 12. The guide rail 483 guides the developing robot 482 to move linearly in the first direction 12. The developing robot 482 has a hand 484, an arm 485, a support 486, and a holder 487. The hand 484 is fixed to the arm 485. The arm 485 is provided in an extendible structure so that the hand 484 is movable in a horizontal direction. The support 486 is provided so that the longitudinal direction thereof is disposed along the third direction 16. The arm 485 is coupled to the support 486 to be linearly movable along the support 486 in the third direction 16. The support 486 is fixedly coupled to the holder 487. The holder 487 is coupled to the guide rail 483 so as to be movable along the guide rail 483.

The developing chambers 460 all have the same structure. However, types of developers used in each developing chamber 460 may be different from each other. The developing chamber 460 removes a region irradiated with light from the photoresist on the substrate W. At this time, a region irradiated with light of a protective film is also removed. Only a region to which light is not irradiated among regions of the photoresist and the protective film may be removed according to a type of a selectively used photoresist.

The developing chamber 460 has a container 461, a support plate 462, and a nozzle 463. The container 461 has a cup shape with an opened upper portion. The support plate 462 is positioned in the container 461 and supports the substrate W. The support plate 462 is provided rotatably. The nozzle 463 supplies a developer onto the substrate W placed on the support plate 462. The nozzle 463 has a circular pipe shape, and may supply a developer to the center of the substrate W. Optionally, the nozzle 463 may have a length corresponding to the diameter of the substrate W, and the ejection hole of the nozzle 463 may be provided as a slit. In addition, the developing chamber 460 may further include a nozzle 464 for supplying a cleaning liquid such as deionized water to clean the surface of the substrate W to which the developer is additionally supplied.

The bake chamber 470 heat-treats the substrate W. For example, the bake chambers 470 perform a post-bake process of heating the substrate W before the developing process is performed, a hard bake process of heating the substrate W after the developing process is performed, a cooling process of cooling the substrate W heated after each back process, and the like. The bake chamber 470 has a cooling plate 471 or a healing plate 472. The cooling plate 471 is provided with a cooling means 473 such as a coolant or a thermoelectric element. In addition, the heating plate 472 is also provided with a healing means 474 such as a hot wire or thermoelectric element. The cooling plate 471 and the heating plate 472 may be provided in one bake chamber 470, respectively. Optionally, some of the bake chambers 470 may include only the cooling plate 471, and other bake chambers 470 may include only the heating plate 472.

As described above, in the coating and developing module 400, the coating module 401 and the developing module 402 are provided to be separated from each other. In addition, when viewed from the top, the coating module 401 and the developing module 402 may have the same chamber arrangement.

The second buffer module 500 is provided as a passage through which the substrate W is transported between the coating and developing module 400 and the pre/post-exposure treating module 600. In addition, the second buffer module 500 performs a predetermined process, such as a cooling process or an edge exposure process, on the substrate W. The second buffer module 500 includes a frame 510, a buffer 520, a first cooling chamber 530, a second cooling clamber 540, an edge exposure chamber 550, and a second buffer robot 560. The frame 510 has a rectangular parallelepiped shape. The buffer 520, the first cooling chamber 530, the second cooling chamber 540, the edge exposure chamber 550, and the second buffer robot 560 are positioned in the frame 510. The buffer 520, the first cooling chamber 530, and the edge exposure chamber 550 are disposed at a height corresponding to the coating module 401. The second cooling chamber 540 is disposed at a height corresponding to the developing module 402. The buffer 520, the first cooling chamber 530, and the second cooling chamber 540 are sequentially disposed in a line along the third direction 16. When viewed from the top, the buffer 520 is disposed along the first direction with the transfer chamber 430 of the coating module 401. The edge exposure chamber 550 is disposed to be spaced apart from the buffer 520 or the first cooling chamber 530 by a predetermined distance in the second direction 14.

The second buffer robot 560 transfers the substrate W among the buffer 520, the first cooling chamber 530, and the edge exposure chamber 550. The second buffer robot 560 is positioned between the edge exposure chamber 550 and the buffer 520. The second buffer robot 560 may be provided in a structure similar to that of the first buffer robot 360. The first cooling chamber 530 and the edge exposure chamber 550 perform a subsequent process on the substrates W on which the process is performed in the coating module 401. The first cooling chamber 530 cools the substrate W on which the process is performed in the coating module 401. The first cooling chamber 530 has a structure similar to that of the cooling chamber 350 of the first buffer module 300. The edge exposure chamber 550 exposes edges of the substrates W on which the cooling process is performed in the first coding chamber 530. The buffer 520 temporarily stores the substrate W before the substrates W, which has been processed in the edge exposure chamber 550, are transferred to a pre-treating module 601 to be described below. The second cooling chamber 540 cools the substrates W before the substrates W, which have been processed in a post-treating module 602 to be described below, are transferred to the developing module 402. The second buffer module 500 may further have a buffer added at a height corresponding to that of the developing module 402. In this case, the substrates W that have been processed in the post-treating module 602 may be temporarily stored in the added buffer and then transferred to the developing module 402.

When the exposure apparatus 900 performs an immersion exposure process, the pre/post-exposure treating module 600 may treat a process of coating a passive layer for protecting a photoresist film coated on the substrate W during an immersion exposure. In addition, the pre/post-exposure treating module 600 may perform a process of cleaning the substrate W after exposure. In addition, when the coating process is performed using a chemically amplified resist the pre/post-exposure treating module 600 may perform a bake process after exposure.

The pre/post-exposure treating module 600 has a pre-treating module 601 and a post-treating module 602. The pre-treating module 601 performs a processor treating the substrate W before performing the exposure process, and the post-treating module 602 performs a process of treating the substrate W after the exposure process. The pre-treating module 601 and the post-treating module 602 are disposed to be partitioned from each other in layers. According to the exemplary embodiment, the pre-treating module 601 is positioned above the post-treating module 602. The pre-treating module 601 is provided at the same height as the coating module 401. The post-treating module 602 is provided at the same height as the developing module 402. The pre-treating module 601 has a protective film coating chamber 610, a bake chamber 620, and a transfer chamber 630. The protective film coating chamber 610, the transfer chamber 630, and the bake chamber 620 are disposed sequentially along the second direction 14. Accordingly, the protective film coating chamber 610 and the bake chamber 620 are spaced apart from each other in the second direction 14 with the transfer chamber 630 interposed therebetween. A plurality of protective film coating chambers 610 is provided and disposed along the third direction 16 to form different layers. Optionally, a plurality of protective film coating chambers 610 may be provided in the first direction 12 and the third direction 16, respectively. A plurality of bake chambers 620 is provided and disposed along the third direction 16 to form different layers. Optionally, a plurality of bake chambers 620 may be provided in the first direction 12 and the third direction 16, respectively.

The transfer chamber 630 is positioned in parallel with the first cooling chamber 530 of the second buffer module 500 in the first direction 12. A pre-treating robot 632 is positioned in the transfer chamber 630. The transfer chamber 630 has a substantially square or rectangular shape. The pre-treating robot 632 transfers the substrate W among the protective film coating chambers 610, the bake chambers 620, the buffer 520 of the second buffer module 500, and a first buffer 720 of the interface module 700 to be described below. The pre-treating robot 632 has a hand 633, an arm 634, and a support 635. The hand 633 is fixed to the arm 634. The arm 634 is provided in an extendible structure and a rotatable structure. The arm 634 is coupled to the support 635 to be linearly movable along tire support 635 in the third direction 16.

The protective film coating chamber 610 coats a protective film for protecting the resist film during immersion exposure on the substrate W. The protective film coating chamber 610 has a housing 611, a support plate 612, and a nozzle 613. The housing 611 has a cup shape with an opened upper portion. The support plate 612 is positioned in the housing 611 and supports the substrate W. The support plate 612 is provided rotatably. The nozzle 613 supplies a protective liquid for forming the protective film onto the substrate W placed on the support plate 612. The nozzle 613 has a circular pipe shape, and may supply the protective liquid to the center of the substrate W. Optionally, the nozzle 613 may have a length corresponding to the diameter of the substrate W, and the ejection hole of the nozzle 613 may be provided as a slit. In this case, the support plate 612 may be provided in a fixed state. The protective liquid includes a foaming material. As the protective liquid, a material having low affinity with a photoresist and water may be used. For example, the protective liquid may contain a fluorine-based solvent. The protective film coating chamber 610 supplies the protective liquid to the central region of the substrate W while rotating the substrate W placed on the support plate 612.

The bake chamber 620 heat-treats the substrate W on which the protective film is coated. The hike chamber 620 has a cooling plate 621 or a heating plate 622. The cooling plate 621 is provided with a cooling means 623 such as a coolant or a thermoelectric element. In addition, the heating plate 622 is also provided with a heating means 624, such as a hot wire or thermoelectric element. The heating plate 622 and the cooling plate 621 may be provided in one bake chamber 620, respectively. Optionally, some of the bake chambers 620 may include only the heating plate 622, and other bake chambers 620 may include only the cooling plate 621.

The post-treating module 602 has a cleaning chamber 660, a post-exposure bake chamber 670, and a transfer chamber 680. The cleaning chamber 660, the transfer chamber 680, and the post-exposure bake chamber 670 are disposed sequentially along the second direction 14. Accordingly, the cleaning chamber 660 and the post-exposure bake chamber 670 are spaced apart from each other in the second direction 14 with the transfer chamber 680 interposed therebetween. A plurality of cleaning chambers 660 is provided and disposed along the third direction 16 to form different layers. Optionally, a plurality of cleaning chambers 660 may be provided in the first direction 12 and the third direction 16, respectively. A plurality of post-exposure bake chambers 670 is provided and may be disposed along the third direction 16 to form different layers. Optionally, a plurality of post-exposure bake chambers 670 may be provided in the first direction 12 and the third direction 16, respectively.

The transfer chamber 680 is positioned in parallel with the second cooling chamber 540 of the second buffer module 500 in the first direction 12 when viewed from the top. The transfer chamber 680 has a substantially square or rectangular shape. A post-treating robot 682 is positioned in the transfer chamber 680. The post-treating robot 682 transfers the substrate W among the cleaning chambers 660, the post-exposure bake chambers 670, the second cooling chamber 540 of the second buffer module 500, and a second buffer 730 of the interface module 700 to be described below. The post-treating robot 682 provided in the post-treating module 602 may be provided in the same structure as the pre-treating robot 632 provided in the pre-treating module 601.

The cleaning chamber 660 cleans the substrate W after the exposure process. The cleaning chamber 660 has a housing 661, a support plate 662, and a nozzle 663. The housing 661 has a cup shape with an opened upper portion. The support plate 662 is positioned in the housing 661 and supports the substrate W. The support plate 662 is provided rotatably, the nozzle 663 supplies a cleaning liquid onto the substrate W placed on the support plate 662. As the cleaning liquid, water such as deionized water may be used. The cleaning chamber 660 supplies the cleaning liquid to the central region of the substrate W while rotating the substrate W placed on the support plate 662. Optionally, while the substrate W is rotated, the nozzle 663 may move linearly or rotationally from the center region to the edge region of the substrate W.

The post-exposure bake chamber 670 heats the substrate W on which the exposure process is performed using far ultraviolet rays. In the post-exposure bake process, a property change of the photoresist is completed by heating the substrate W to amplify acid generated in the photoresist by exposure. The post-exposure bake chamber 670 has a heating plate 672. The heating plate 672 is also provided with a heating means 674 such as a hot wire or thermoelectric element. The post-exposure bake chamber 670 may further include a cooling plate 671 therein. The cooling plate 671 is provided with a cooling means 673 such as a coolant or a thermoelectric element. In addition, optionally, a bake chamber having only the cooling plate 671 may be further provided.

As described above, in the pre/post-exposure treating module 600, the pre-treating module 601 and the post-treating module 602 are provided to be separated from each other. In addition, the transfer chamber 630 of the pre-treating module 601 and the transfer chamber 680 of the post-treating module 602 may be provided at the same size to completely overlap with each other when viewed from the top. In addition, the protective film coating chamber 610 and the cleaning chamber 660 may be provided at the same size as each other and to completely overlap with each other when viewed from the top. In addition, the bake chamber 620 and the post-exposure bake chamber 670 may be provided at the same size and to completely overlap with each other when viewed from the top.

The interface module 700 transfers the substrate W between the pre post-exposure treating module 600 and the exposure apparatus 900. The interface module 700 has a frame 710, a first buffer 720, a second chamber 730, and an interface robot 740. The first buffer 720, the second chamber 730, and the interface robot 740 are positioned in the frame 710. The first buffer 720 and the second buffer 730 are spaced apart from each other by a predetermined distance and are disposed to be stacked on each other. The first buffer 720 is disposed higher than the second buffer 730. The first buffer 720 is positioned at a height corresponding to the pre-treating module 601, and the second buffer 730 is positioned at a height corresponding to the post-treating module 602. When viewed from the top, the first buffer 720 is disposed in a line along the first direction 12 with the transfer chamber 630 of the pre-treating module 601, and the second buffer 730 is positioned in a line along the first direction 12 with the transfer chamber 630 of the post-treating module 602.

The interface robot 740 is positioned to be spaced apart from the first buffer 720 and the second buffer 730 in the second direction 14. The interface robot 740 transfers the substrate W among the first buffer 720, the second buffer 730, and the exposure apparatus 900. The interface robot 740 has a structure substantially similar to that of the second buffer robot 560.

The first buffer 720 temporarily stores the substrates W, which are processed in the pro-treating module 601, before the substrates W are moved to the exposure apparatus 900. In addition, the second buffer 730 temporarily stores the substrates W, which have been processed in the exposure apparatus 900, before the substrates W are moved to the post-treating module 602. The first buffer 720 has a housing 721 and a plurality of supports 722. The supports 722 are disposed in the housing 721 and are provided to be spaced apart from each other along the third direction 16. One substrate W is placed on each support 722. The housing 721 has openings (not illustrated) in a direction in which the interface robot 740 is provided and a direction in which the pre-treating robot 632 is provided, so that the interface robot 740 and the pre-treating robot 632 may carry in or out the substrate W to the support 722 in the housing 721. The second buffer 730 has a structure substantially similar to the first buffer 720. However, the housing 721 of tire second buffer 730 has openings (not illustrated) in the direction in which the interface robot 740 is provided and the direction in which the post-treating robot 682 is provided. As described above, only the buffers and the robot may be provided in the interface module without providing a chamber for performing a predetermined process on the substrate W.

Next, an example of performing the process using the substrate treating apparatus 1 described above will be described.

The cassette 20 in which the substrates W are received is placed on the mounting table 120 of the load port 100. A door of the cassette 20 is opened by an door opener. The index robot 220 takes out the substrate W from the cassette 20 anti then transfers the substrate W to the second buffer 330.

The first buffer robot 360 transfers the substrate W stored in the second buffer 330 to the first buffer 320. The coating robot 432 takes out the substrate W from the first buffer 320 and then transfers the substrate W to the bake chamber 420 of the coating module 401. The bake chamber 420 sequentially performs pre-baking and cooling processes. The coating robot 432 takes out the substrate W from the bake chamber 420 and then transfers the substrate W to the resist coating chamber 410. The resist coating chamber 410 coals a photoresist on the substrate W. Thereafter, when the photoresist is coated on the substrate W, the coaling robot 432 transfers the substrate W from the resist coating chamber 410 to the bake chamber 420. The bake chamber 420 performs a soft baking process on the substrate W.

The coating robot 432 takes out the substrate W from the bake chamber 420 and then transfers the substrate W to the first cooling chamber 530 of the second buffer module 500. A cooling process is performed on the substrate W in the first cooling chamber 530. The substrate W, which is processed in the first cooling chamber 530, is transferred to the edge exposure chamber 550 by the second buffer robot 560. The edge exposure chamber 550 performs a process of exposing an edge region of the substrate W. The substrate W, which has been processed in the edge exposure chamber 550, is transferred to the buffer 520 by the second buffer robot 560.

The pre-treating robot 632 takes out the substrate W from the buffer 520 then transfers the substrate W to the protective film coating chamber 610 of the pre-treating 601. The protective film coating chamber 610 coals the protective film on the substrate W. Thereafter, the pre-treating robot 632 transfers the substrate W from the protective film coating chamber 610 to the bake chamber 620. The bake chamber 620 performs heat-treatment such as heating and cooling on the substrate W.

The pre-treating robot 632 takes out the substrate W from the bake chamber 620 and then transfers the substrate W to the first buffer 720 of the interface module 700. The interface robot 740 transfers the substrate W from the first buffer 720 to the exposure apparatus 900. The exposure apparatus 900 performs an exposure process, for example, an immersion exposure process, on a treated surface of the substrate W. When the exposure process for the substrate W is completed in the exposure apparatus 900, the interface robot 740 transfers the substrate W from the exposure apparatus 900 to the second buffer 730.

The post-treating robot 682 takes out the substrate W from the second buffer 730 and then transfers the substrate W to the cleaning chamber 660 of the post-treating module 602. The cleaning chamber 660 performs a cleaning process by supplying a cleaning liquid to the surface of the substrate W. When the cleaning of the substrate W using the cleaning liquid is completed the post-treating robot 682 immediately takes out the substrate W from the cleaning chamber 660 and then transfers the substrate W to the post-exposure bake chamber 670. In the heating plate 672 of the post-exposure bake chamber 670, the cleaning liquid attached on the substrate W is removed by heating of the substrate W and simultaneously, acid generated in the photoresist is amplified so that a property change of the photoresist is completed. The post-treating robot 682 transfers the substrate W from the post-exposure bake chamber 670 to the second cooling chamber 540 of the second buffer module 500. The cooling of the substrate W is performed in the second cooling chamber 540.

The developing robot 482 takes out the substrate W from the second cooling chamber 540 and then transfers the substrate W to the bake chamber 470 of the developing module 402. The bake chamber 470 sequentially performs post-baking and cooling processes. The developing robot 482 takes out the substrate W from the bake chamber 470 and then transfers the substrate W to the developing chamber 460. The developing chamber 460 supplies a developer onto the substrate W to perform a developing process. Thereafter, the developing robot 482 transfers the substrate W from the developing chamber 460 to the bake chamber 470. The bake chamber 470 performs a hard baking process on the substrate W.

The developing robot 482 takes out the substrate W from the bake chamber 470 and then transfers the substrate W to the cooling chamber 350 of the first buffer module 300. The cooling chamber 350 performs a process of cooling the substrate W. The index robot 360 transfers the substrate W from the cooling chamber 350 to the cassette 20. Unlike this, the developing robot 482 takes out the substrate W from the bake chamber 470, transfers the substrate W to the second buffer 330 of the first buffer module 300, and then transfers the substrate W to the cassette 20 by the index robot 360.

What is claimed is:

1. An apparatus for treating a substrate comprising:
   a cup configured to have a treating space with an opened upper portion;
   a support base configured to support the substrate in the treating space;
   a liquid supply unit configured to have a treating liquid supply nozzle for supplying a treating liquid to the substrate supported by the support base; and
   a nozzle standby port which is positioned outside the treating space, provides a standby space in which the treating liquid supply nozzle stands by before and after treating the substrate in the treating space, and provides cleaning of the treating liquid supply nozzle positioned in the standby space,
   wherein the nozzle standby port comprises:
   a liquid tank configured to accommodate the cleaning liquid ejected to a nozzle tip of the treating liquid supply nozzle;
   a cover that is disposed on an upper surface of the liquid tank and provides an insertion hole with a larger diameter than the nozzle tip so that the nozzle tip is insertable; and
   a spray chamber configured to spray the cleaning liquid to the nozzle tip inserted into the insertion hole, the spray chamber being embedded in the cover above the upper surface of the liquid tank, and
   wherein an impact point of the cleaning liquid is spaced apart from a center of the nozzle tip at a predetermined distance.

2. The apparatus for treating the substrate of claim 1, wherein the spray chamber further comprises:
   a container embedded in the cover above the upper surface of the liquid tank and configured to receive and store the cleaning liquid from a cleaning liquid supply source; and
   an ejection hole formed in the container to eject the cleaning liquid when a predetermined level of cleaning liquid is supplied to the container.

3. The apparatus for treating the substrate of claim 2, wherein the container is provided in a ring shape surrounding the insertion hole.

4. The apparatus for treating the substrate of claim 2, wherein another pair of ejection holes is provided to surround the nozzle tip inserted into the insertion hole.

5. The apparatus for treating the substrate of claim 1, wherein the nozzle standby port further comprises:
   a disperser provided in the liquid tank and positioned below the insertion hole.

6. The apparatus for treating the substrate of claim 5, wherein the nozzle standby port further comprises an exhaust port configured to exhaust an atmosphere in the liquid tank, and
   wherein the disperser is positioned below the exhaust port.

7. The apparatus for treating the substrate of claim 5, wherein the disperser is provided in a spherical shape.

8. The apparatus for treating the substrate of claim 5, wherein an upper surface of the disperser is provided to be inclined downward toward a bottom.

9. The apparatus for treating the substrate of claim 5, wherein a concave portion is formed on a lower surface of the disperser.

10. The apparatus for treating the substrate of claim 1, wherein the liquid supply unit further comprises:
    a pre-wetting liquid supply nozzle configured to supply a pre-wetting liquid onto the substrate; and
    a support body configured to support the treating liquid supply nozzle and the pre-wetting liquid supply nozzle.

11. The apparatus for treating the substrate of claim 10, wherein the treating liquid is a photoresist, and
    wherein the cleaning liquid and the pre-wetting liquid are provided as a thinner.

12. The apparatus for treating the substrate of claim 1, wherein the predetermined distance is provided further as a diameter of the nozzle tip increases.

\* \* \* \* \*